(12) United States Patent
Noro et al.

(10) Patent No.: US 6,330,180 B2
(45) Date of Patent: Dec. 11, 2001

(54) SEMICONDUCTOR MEMORY DEVICE WITH REDUCED POWER CONSUMPTION AND WITH REDUCED TEST TIME

(75) Inventors: Kouichi Noro; Yoshioka Hiroshi, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/770,286

(22) Filed: Jan. 29, 2001

(30) Foreign Application Priority Data

Mar. 24, 2000 (JP) .................................. 12-085318
Mar. 29, 2000 (JP) .................................. 12-092226

(51) Int. Cl.[7] .................................. G11C 11/22
(52) U.S. Cl. .......................... 365/145; 365/226
(58) Field of Search ..................... 365/226, 145

(56) References Cited

U.S. PATENT DOCUMENTS 6,215,693 * 4/2001 Chung et al. ................ 365/145

FOREIGN PATENT DOCUMENTS 5-120881  5/1993  (JP) .

\* cited by examiner

Primary Examiner—David Nelms
Assistant Examiner—M. Tran
(74) Attorney, Agent, or Firm—Arent Fox Kintner Plotkin & Kahn, PLLC

(57) ABSTRACT

A semiconductor memory device includes ferroelectric memory cells, cell transistors connected between first nodes of the memory cells and data transfer lines, the memory cells and the cell transistors being grouped into units each corresponding to one or more column addresses, global word lines, one of which is activated in response to selection of a corresponding row address, global plate lines, one of which is activated in response to selection of the corresponding row address, local word lines, each of which is provided and dedicated for a corresponding one of the units, and is connected to gates of the cell transistors, local plate lines, each of which is provided and dedicated for a corresponding one of the units, and is connected to second nodes of the memory cells, and a unit switch circuit which electrically connects the activated one of the global word lines to one of the local word lines in a selected one of the units so as to achieve the same potential therebetween, and electrically connects the activated one of the global plate lines to one of the local plate lines in the selected one of the units so as to achieve the same potential therebetween.

10 Claims, 20 Drawing Sheets

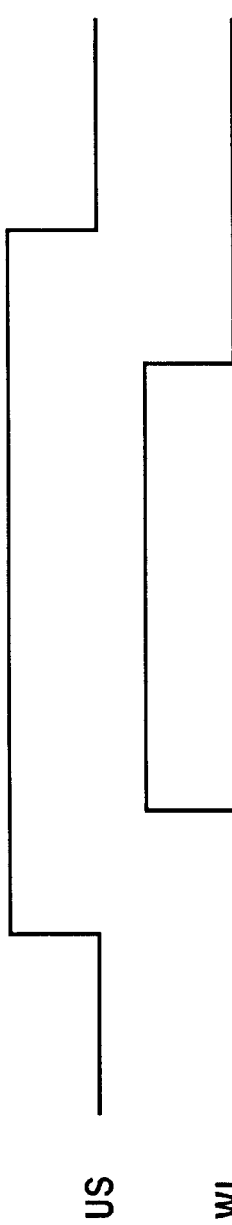
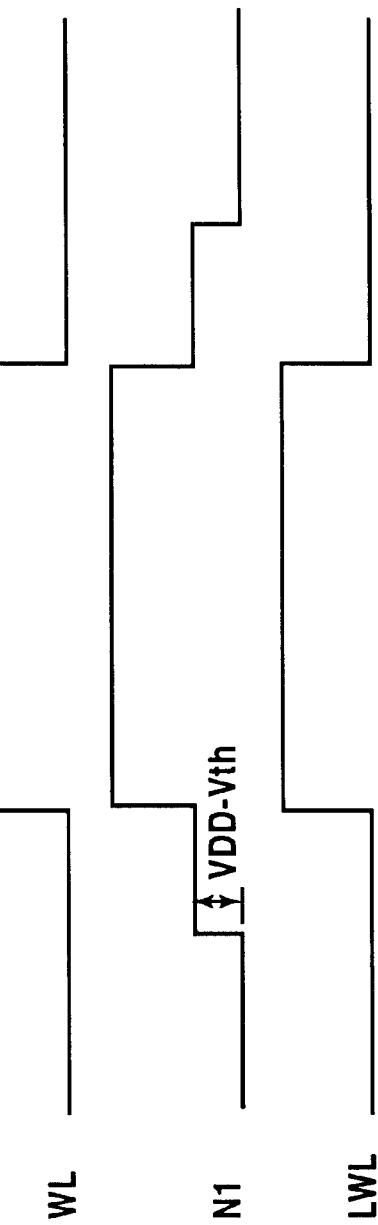
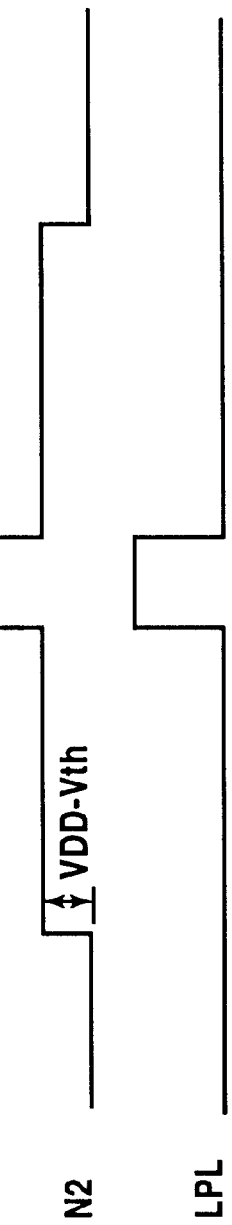
FIG.4A US
FIG.4B WL
FIG.4C N1
FIG.4D LWL
FIG.4E PL
FIG.4F N2
FIG.4G LPL

FIG.9A US
FIG.9B WL
FIG.9C N1
FIG.9D LWL
FIG.9E PL
FIG.9F N2
FIG.9G LPL

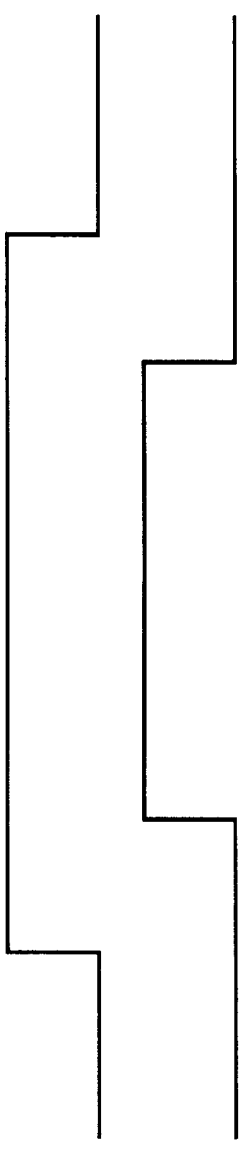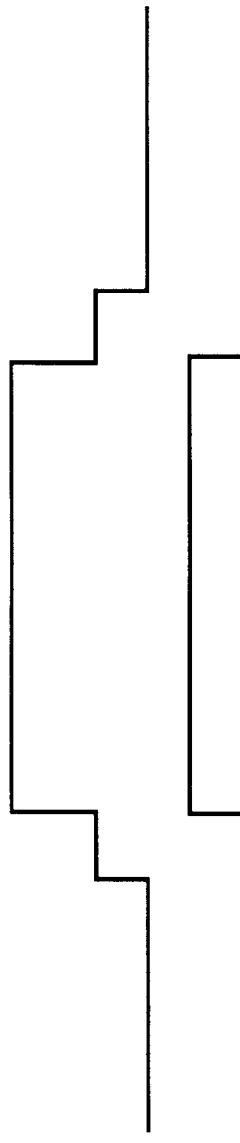
FIG.11A US
FIG.11B WL
FIG.11C N1
FIG.11D LWL
FIG.11E PL
FIG.11F N2
FIG.11G LPL

SEMICONDUCTOR MEMORY DEVICE WITH REDUCED POWER CONSUMPTION AND WITH REDUCED TEST TIME

BACKGROUND OF THE INVENTION

1. Field of the Invention

The present invention generally relates to semiconductor memory devices using ferroelectric, and particularly relates to a ferroelectric semiconductor memory device with reduced power consumption.

2. Description of the Related Art

Ferroelectric random access memory devices (FRAM) employ ferroelectric as memory cells, and are non-volatile memories that store information as a position of electron inside the crystal structure of ferroelectric.

In DRAMs (dynamic random access memories), either a HIGH voltage or a LOW voltage representing record data is applied to one node of a memory capacitor, so that electrical charge is stored as data between this node and the other node serving as a ground node. In contrast, FRAM data recording is not accomplished by merely applying a HIGH voltage or a LOW voltage to one node of a ferroelectric device. In order to store information, it is necessary to apply a positive-voltage pulse signal to a node of a ferroelectric device while applying a data voltage to another node of the ferroelectric device.

The node to which the positive-voltage pulse signal is applied at the time of data writing is referred to as a plate, which is connected to a plate line for controlling the plate voltage. When a word line is selected, a plate line corresponding to the activated word line is selectively activated, thereby writing data in the selected memory cell.

Data-write operation in FRAMs is substantially the same as data-write operation of DRAMs, except for control of the plate voltage. In brief, a work line is activated to make cell transistors conductive, so that data on the bit lines are written in memory cells through the cell transistors, followed by deactivating the word line after data writing so as to make the cell transistors nonconductive. In FRAMs, a plate line is selectively activated simultaneously with selection of a word line, thereby accomplishing data writing in the ferroelectric memory cells.

FIG. 1 is a block diagram of a typical ferroelectric semiconductor memory device.

An FRAM 510 of FIG. 1 includes an address processing unit 511, a data input/output unit 512, a control unit 513, a word decoder 514, a plate decoder 515, a column decoder 516, a cell circuit 517, and a sense amplifier unit 518.

The cell circuit 517 includes a plurality of cells arranged in a matrix form where the cells are based on ferroelectric memory devices. Further, the cell circuit 517 includes circuitry and wires used for specifying addresses and transferring data when 1-bit data is read from or written in each cell.

The address processing unit 511 is comprised of circuits such as address buffers, address pre-decoders, and so on. The address processing unit 511 receives address signals from an exterior of the device, and supplies the signals to the word decoder 514, plate decoder 515, and the column decoder 516 at appropriate timings.

The data input/output unit 512 is comprised of circuits such as data buffers, and supplies data to the sense amplifier unit 518 at appropriate timings as the data is received from the exterior of the device. Further, the data input/output unit 512 outputs data to the exterior of the device at appropriate timings as the data is read from the cell circuit 517 via the sense amplifier unit 518. The sense amplifier unit 518 amplifies the data to be written, and supplies the amplified data to the cell circuit 517. Also, the sense amplifier unit 518 amplifies data read from the cell circuit 517.

The control unit 513 includes circuits such as control-signal buffers, a command decoder, etc., and receives control signals and a clock signal from the exterior of the device. The control unit 513 decodes a command represented by the control signals, and controls operation and timing of each circuit unit provided in the FRAM 510. Namely, the control unit 513 supplies clock signals and timing signals to each circuit unit of the FRAM 510, so that each circuit unit operates at appropriate timing, thereby achieving data read/data-write operation of the FRAM 510.

The word decoder 514 decodes a row address supplied from the address processing unit 511, and selectively activates one of the word lines WL corresponding to the row address. As a result, cell transistors connected to the activated word line WL become conductive, so that data-read/data-write operation is conducted with respect to the memory cells of the selected word address.

The plate decoder 515 decodes the row address supplied from the address processing unit 511, and selectively activates one of the plate lines PL corresponding to the row address. In FRAMs, data writing is carried out by applying a HIGH voltage to a node of a ferroelectric device connected to the plate line PL while applying a data voltage of either HIGH or LOW to the other node of the ferroelectric device. Concurrently with the word selection by the word line WL, the plate line PL is selectively activated at a position corresponding to the activated word line WL, thereby achieving data writing in the selected memory cells.

The column decoder 516 decodes a column address supplied from the address processing unit 511, and selectively activates one of the column lines corresponding to the column address. As a result, a corresponding column transistor becomes conductive, connecting a corresponding sense amplifier of the sense amplifier unit 518 to the data input/output unit 512.

In the case of data-read operation, data are read from memory cells connected to the activated word line WL, and appear on bit lines. The sense amplifier unit 518 then amplifies the data on the bit lines. The amplified data is read from a sense amplifier corresponding to the activated column line, and is supplied to the data input/output unit 512. In the case of data-write operation, in the manner reverse to the data-read operation, data is supplied from the data input/output unit 512 to a sense amplifier that is selected by the activated column line. When a word line WL is activated, a memory cell connected to the activated word line WL receives data through bit lines from the sense amplifier unit 518. When this happens, a plate line PL connected to the memory cell is selectively activated, corresponding to the activated word line WL.

In FRAMs, data is destroyed by data-read operation. Namely, when data is read from a ferroelectric device, this data-read operation destroys the data that has been stored in the ferroelectric device. In the same manner as in DRAMs, therefore, data writing must be carried out as part of data-read operation with respect to a memory cell after data is read from the memory cell connected to the activated word line WL. Namely, both the word line WL and the plate line PL need to be activated in both the data-write operation and the data-read operation.

In the configuration of FIG. 1, the word lines WL and the plate lines PL extend over a wide span in the cell circuit 517.

At the time of data-read operation or data-write operation, therefore, the word line WL and the plate line PL are activated not only with respect to a cell that is accessed for data reading or data writing, but also with respect to cells that are not being accessed. Because of this, electric power consumed by the word line WL and the plate line PL is wasted.

As a simple and straightforward measure, the cell circuit may be divided into a plurality of blocks in the column direction, with a word-line driver and a plate-line driver being provided with respect to each block. In this case, however, the numbers of word-line drivers and plate-line drivers increases, resulting in an undesirable increase of chip size.

Accordingly, there is a need for an FRAM with reduced power consumption.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor memory device which includes ferroelectric memory cells, cell transistors connected between first nodes of the memory cells and data transfer lines, the memory cells and the cell transistors being grouped into units each corresponding to one or more column addresses, global word lines, one of which is activated in response to selection of a corresponding row address, global plate lines, one of which is activated in response to selection of the corresponding row address, local word lines, each of which is provided and dedicated for a corresponding one of the units, and is connected to gates of the cell transistors, local plate lines, each of which is provided and dedicated for a corresponding one of the units, and is connected to second nodes of the memory cells, and a unit switch circuit which electrically connects the activated one of the global word lines to one of the local word lines in a selected one of the units so as to achieve the same potential therebetween, and electrically connects the activated one of the global plate lines to one of the local plate lines in the selected one of the units so as to achieve the same potential therebetween.

In the semiconductor memory device described above, one or more column addresses constitute a unit, and a local word line is provided for each unit as a dedicated word line. Then, a local word line in a selected unit is connected to a global word line. Further, a local plate line is provided for each unit as a dedicated plate line. Then, a local plate line in the selected unit is connected to a global plate line. This makes it possible to activate a local word line and local plate line only in the selected unit, thereby avoiding excessive power consumption.

Moreover, it is another and more specific object of the present invention to provide a semiconductor memory device with a reduced test time. A need for such a semiconductor memory device will become apparent from the description of embodiments which follows.

In order to achieve the above object according to the present invention, a semiconductor memory device includes ferroelectric memory cells, bit lines which transfer data read from or written to the memory cells, cell transistors which connect between the memory cells and the bit lines, word lines which control on/off states of the cell transistors, word-line driving circuits which drive the word lines, precharge circuits which precharge the bit lines, and a timing control circuit which controls the word-line driving circuits and the precharge circuits to deactivate a word line prior to commencement of precharge operation in a first mode and to deactivate a word line after commencement of precharge operation in a second mode.

In the semiconductor memory device as described above, the word-line driving circuits and the precharge circuits are controlled so as to deactivate a word line after commencement of precharge operation in the second mode. When the cell transistors become nonconductive, therefore, the data voltages are already removed from the bit lines, so that the parasitic capacitance of the memory cells do not store electrical charge therein. An immediately following data-read operation can thus test the data-retention capability of the memory cells alone. There is no need to set aside a wait time after the data-write operation and before the data-read operation, being different from the case of the related-art test operation. This makes it possible to quickly conduct the memory cell test.

BRIEF DESCRIPTION OF THE DRAWINGS

FIG. 4A through FIG. 4G are timing charts for explaining operation of the circuit of FIG. 3;

FIG. 11A through FIG. 11G are timing charts for explaining operation of the circuit of FIG. 10;

DESCRIPTION OF THE PREFERRED EMBODIMENTS

In the following, embodiments of the present invention will be described with reference to the accompanying drawings.

Figure 1:
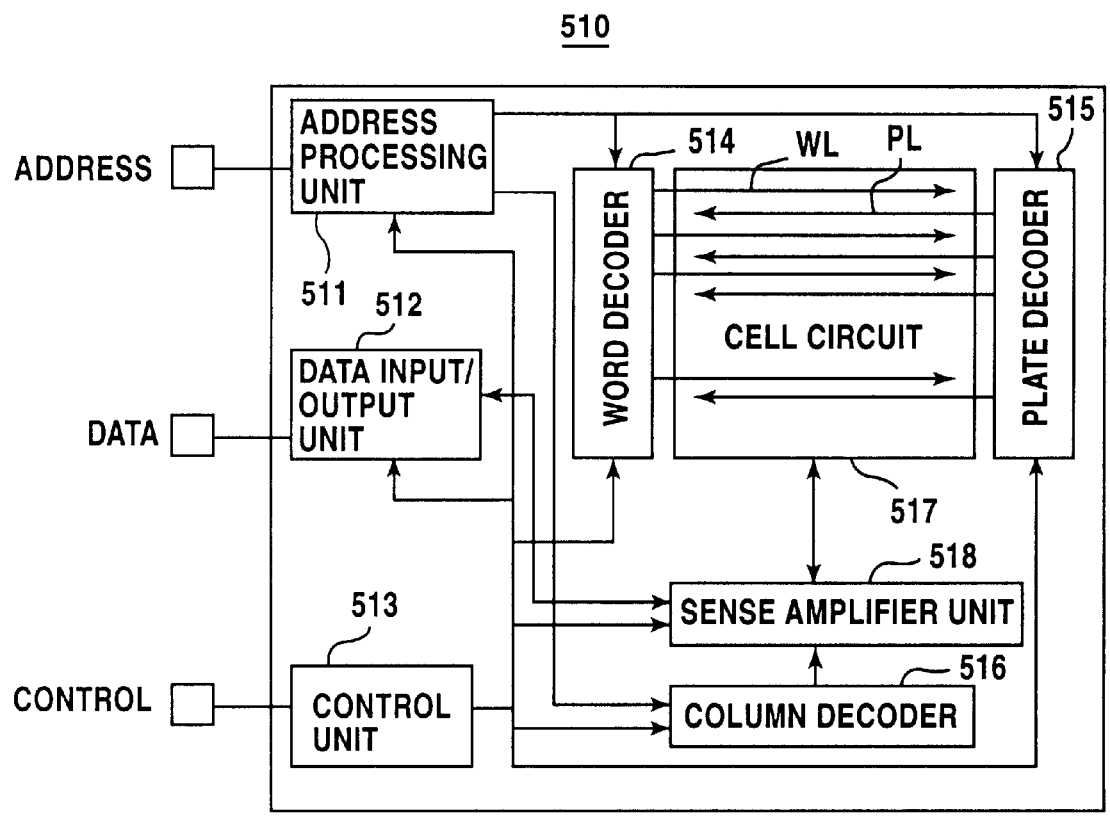
FIG. 1 is a block diagram of a typical ferroelectric semiconductor memory device.
Figure 2:
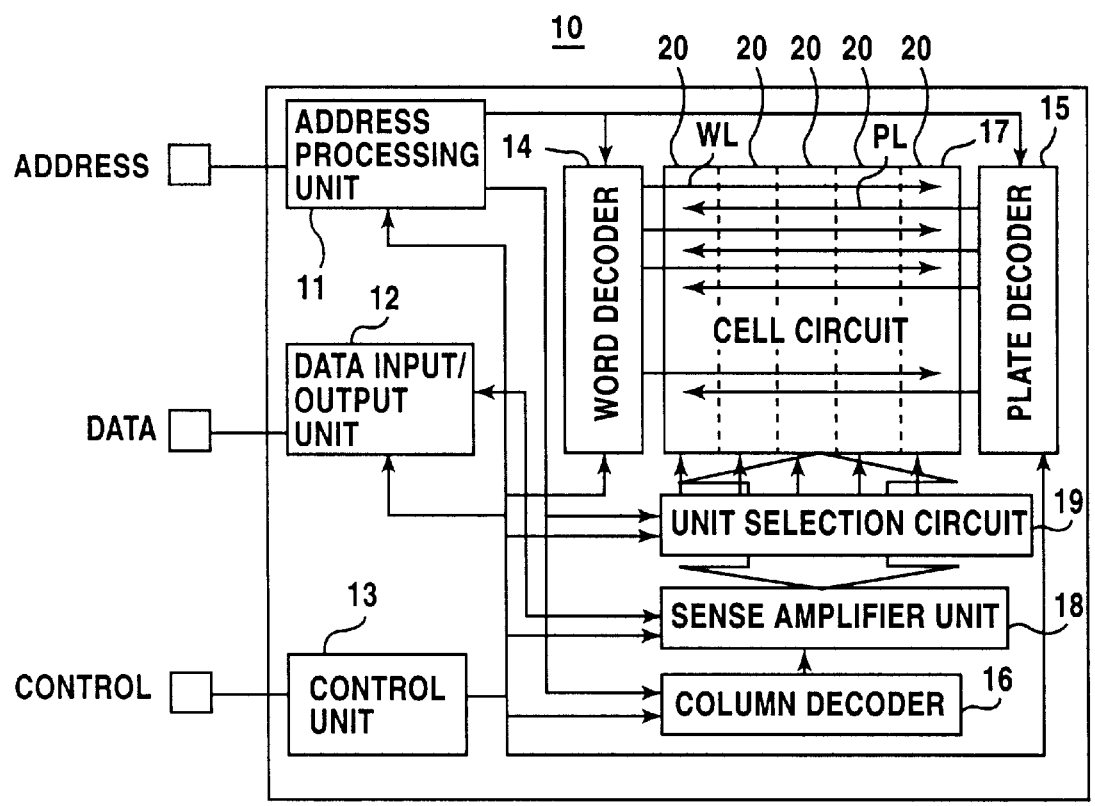
FIG. 2 is a block diagram of a ferroelectric semiconductor memory device according to the present invention.

FIG. 2 is a block diagram of a ferroelectric semiconductor memory device according to the present invention.

An FRAM 10 of FIG. 2 includes an address processing unit 11, a data input/output unit 12, a control unit 13, a word decoder 14, a plate decoder 15, a column decoder 16, a cell circuit 17, a sense amplifier unit 18, and a unit selection circuit 19.

The cell circuit 17 includes a plurality of cells arranged in a matrix form where the cells are based on ferroelectric memory devices. Further, the cell circuit 17 includes circuitry and wires used for specifying addresses and transferring data when 1-bit data is read from or written in each cell. Further, the cell circuit 17 is divided into a plurality of units 20 in the column direction as shown by dotted lines in FIG. 2, and is configured such that data-read/data-write operation is carried out with respect to each unit 20 independently. Hereinafter, this unit is referred to as a cell-array unit 20. Details of the cell-array unit 20 will be described later.

The address processing unit 11 is comprised of circuits such as address buffers, address pre-decoders, and so on. The address processing unit 11 receives address signals from an exterior of the device, and supplies the signals to the word decoder 14, plate decoder 15, the column decoder 16, and the unit selection circuit 19 at appropriate timings.

The data input/output unit 12 is comprised of circuits such as data buffers, and supplies data to the sense amplifier unit 18 at appropriate timings as the data is received from the exterior of the device. Further, the data input/output unit 12 outputs data to the exterior of the device at appropriate timings as the data is read from the cell circuit 17 via the sense amplifier unit 18. The sense amplifier unit 18 amplifies the data to be written, and supplies the amplified data to the cell circuit 17. Also, the sense amplifier unit 18 amplifies data read from the cell circuit 17.

The control unit 13 includes circuits such as control-signal buffers, a command decoder, etc., and receives control signals and a clock signal from the exterior of the device. The control unit 13 decodes a command represented by the control signals, and controls operation and timing of each circuit unit provided in the FRAM 10. Namely, the control unit 13 supplies clock signals and timing signals to each circuit unit of the FRAM 10, so that each circuit unit operates at appropriate timing, thereby achieving data-read/data-write operation of the FRAM 10.

The word decoder 14 decodes a row address supplied from the address processing unit 11, and selectively activates one of the global word lines WL corresponding to the row address.

The plate decoder 15 decodes the row address supplied from the address processing unit 11, and selectively activates one of the global plate lines PL corresponding to the row address.

The unit selection circuit 19 decodes a column address supplied from the address processing unit 11, and selects one of the cell-array units 20 corresponding to the column address.

Each cell-array unit 20 is provided with local word lines and local plate lines dedicated for the unit. In the selected cell-array unit 20, a local word line corresponding to the activated global word line WL is activated to make cell transistors conductive with respect to the cell transistors connected to the activated local word line. As a result, data-read/data-write operation is carried out with respect to the memory cells corresponding to the specified word address. When this happens, a local plate line corresponding to the activated global plate line PL is selectively activated to make it possible to write data in the selected memory cells.

The column decoder 16 decodes the column address supplied from the address processing unit 11, and selectively activates one of the column lines corresponding to the column address. As a result, a corresponding column transistor becomes conductive, connecting a corresponding sense amplifier of the sense amplifier unit 18 to the data input/output unit 12.

The read/write operation is performed separately with respect to each cell-array unit 20. In the case of data-read operation, data are read from memory cells connected to the activated local word line, and appear on bit lines. The sense amplifier unit 18 then amplifies the data on the bit lines. The amplified data is read from a sense amplifier corresponding to the activated column line, and is supplied to the data input/output unit 12. In the case of data-write operation, in the manner reverse to the data-read operation, data is supplied from the data input/output unit 12 to a sense amplifier that is selected by the activated column line. When a local word line is activated, a memory cell connected to the activated local word line receives data through bit lines from the sense amplifier unit 18. When this happens, a local plate line connected to the memory cell is selectively activated, corresponding to the activated local word line.

Figure 3:
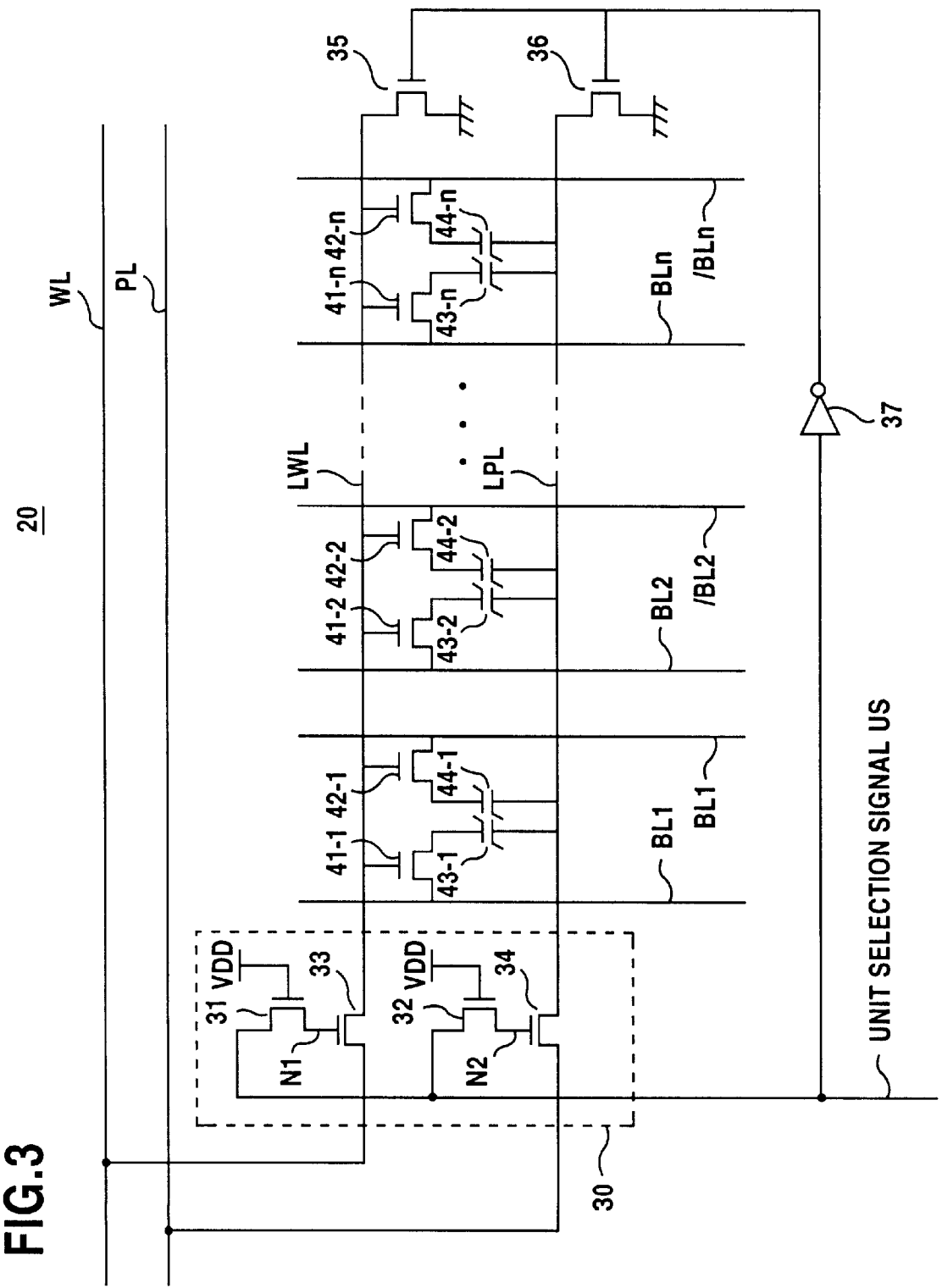
FIG. 3 is a circuit diagram showing a configuration of a first embodiment of a cell-array unit.

FIG. 3 is a circuit diagram showing a configuration of a first embodiment of the cell-array unit 20. The circuit diagram of FIG. 3 shows a relevant portion corresponding to a set of a global word line WL and a global plate line PL among the entire configuration of the cell-array unit 20. The entirety of the cell-array unit 20 is structured by repeating the circuit configuration of FIG. 3 as many as there are global word lines WL and the global plate lines PL.

The cell-array unit 20 of FIG. 3 includes NMOS transistors 31 through 36, an inverter 37, NMOS transistors 41-1 through 41-n and 42-1 through 42-n, ferroelectric memory cells 43-1 through 43-n and 44-1 through 44-n, bit lines BL1 through BLn and /BL1 through /BLn, a local word line LWL, and a local plate line LPL. A unit selection signal US is supplied to a unit switch circuit 30 that includes NMOS transistors 31 through 34. The unit selection circuit 19 (see FIG. 2) supplies the unit selection signal US, which becomes HIGH when the relevant cell-array unit 20 is selected. As the unit selection signal US becomes HIGH, the global word line WL and the global plate line PL are electrically connected to the local word line LWL and the local plate line LPL, respectively.

FIG. 4A through FIG. 4G show signal levels of the unit selection signal US, the global word line WL, a node N1, the local word line LWL, the global plate line PL, a node N2, and the local plate line LPL.

As shown in FIGS. 4A through 4G, the unit selection signal US becomes HIGH prior to activation of the global word line WL and the global plate line PL. As shown in FIG. 3, the NMOS transistors 31 and 32 have gates thereof connected to a HIGH voltage. When the unit selection signal US becomes HIGH, therefore, the voltage levels of the nodes N1 and N2 are set to a voltage level lower than the gate voltage VDD of the NMOS transistors 31 and 32 by a threshold voltage Vth. Namely, the voltage levels of the nodes N1 and N2 are set to VDD-Vth.

When this happens, electrical charge is accumulated at the node N1 through the NMOS transistor 31, resulting in a channel being created in the NMOS transistor 33. By the same token, electrical charge is accumulated at the node N2 through the NMOS transistor 32, resulting in a channel being created in the NMOS transistor 34.

After this, when the global word line WL becomes HIGH, the voltage level of the node N1 is elevated through capacitor coupling with the global word line WL. In an ideal condition, the voltage level of the node N1 becomes equal to a voltage level that is higher than VDD-Vth by a voltage change of the global word line WL. In reality, a voltage increase is not as great as such an ideal voltage increase, but is at least boosted to a voltage level higher than the activated voltage level of the global word line WL. As a result, the gate voltage of the NMOS transistor 33 is set to a sufficiently high voltage, so that the local word line LWL is activated at a voltage level equal to the activated voltage level of the global word line WL.

When the global plate line PL becomes HIGH, the voltage level of the node N2 is elevated through capacitor coupling with the global plate line PL. In an ideal condition, the voltage level of the node N2 becomes equal to a voltage level that is higher than VDD-Vth by a voltage change of the global plate line PL. In reality, a voltage increase is not as great as such an ideal voltage increase, but is at least boosted to a voltage level higher than the activated voltage level of the global plate line PL. As a result, the gate voltage of the NMOS transistor 34 is set to a sufficiently high voltage, so that the local plate line LPL is activated at a voltage level equal to the activated voltage level of the global plate line PL.

When the unit selection signal US is LOW, no channels are created in the NMOS transistors 33 and 34. In this condition, the global word line WL and the global plate line PL are disconnected from the local word line LWL and the local plate line LPL, respectively. Further, when unit selection signal US is LOW, the output of the inverter 37 is HIGH, so that the NMOS transistors 35 and 36 become conductive, resulting in the local word line LWL and the local plate line LPL being clamped to the ground voltage level. In the cell-array units 20 that are not selected, therefore, the local word lines LWL and the local plate lines LPL are fixed to a predetermined voltage level (i.e., the ground voltage in this case) without exception.

Figure 5:
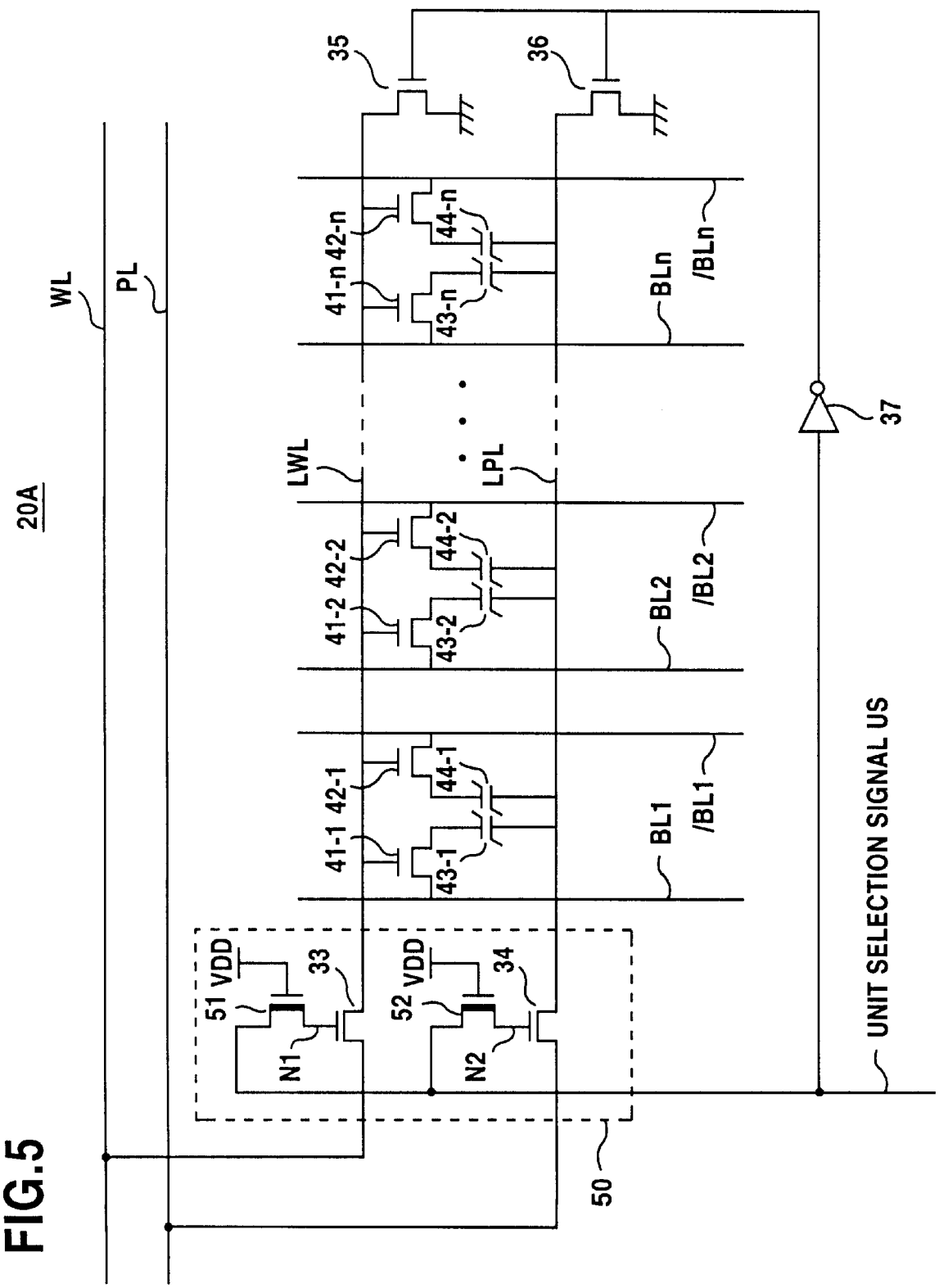
FIG. 5 is a circuit diagram showing a configuration of a second embodiment of the cell array unit.
Figure 6:
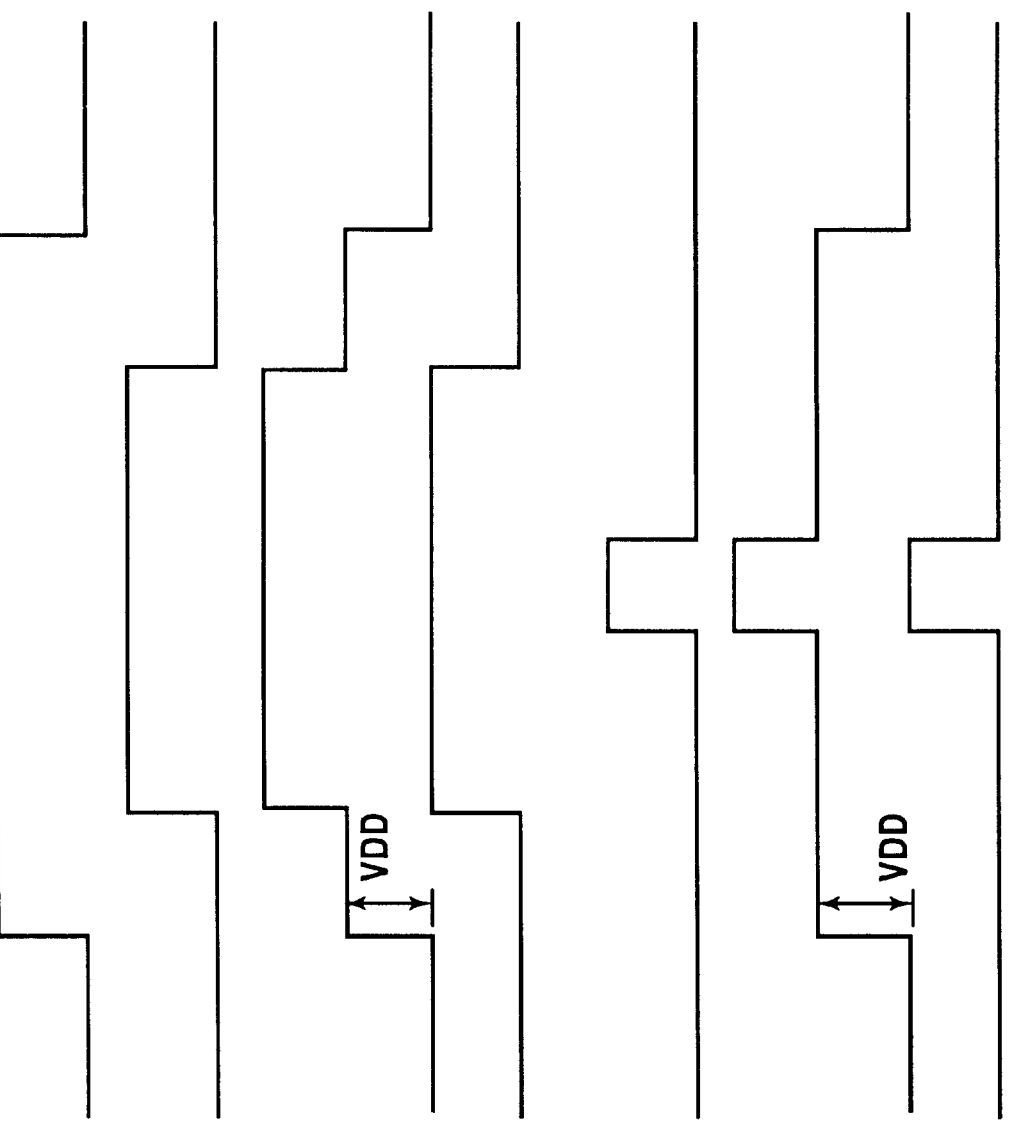
FIG. 6A through FIG. 6G are timing charts for explaining operation of the circuit of FIG. 5.

FIG. 5 is a circuit diagram showing a configuration of a second embodiment of the cell array unit. The circuit diagram of FIG. 5 shows a relevant portion corresponding to a set of a global word line WL and a global plate line PL among the entire configuration of the cell-array unit. The entirety of the cell-array unit is structured by repeating the circuit configuration of FIG. 5 as many as there are global word lines WL and the global plate lines PL. In FIG. 5, the same elements as those of FIG. 3 are referred to by the same numerals, and a description thereof will be omitted.

A cell-array unit 20A of FIG. 5 has the same configuration as the cell-array unit 20 of FIG. 3 with an exception that depletion-type transistors 51 and 52 are provided in place of the NMOS transistors 31 and 32, respectively. A unit selection signal US is supplied to a unit switch circuit 50 that includes the depletion-type transistors 51 and 52 and the NMOS transistors 33 and 34. As the cell-array unit 20A is selected, the unit selection signal US becomes HIGH, so that the global word line WL and the global plate line PL are electrically connected to the local word line LWL and the local plate line LPL, respectively.

FIG. 6A through FIG. 6G show signal levels of the unit selection signal US, the global word line WL, a node N1, the local word line LWL, the global plate line PL, a node N2, and the local plate line LPL.

As can be seen from comparison of FIGS. 6A through 6G with FIGS. 4A through 4G, the cell-array unit 20 of the first embodiment and the cell-array unit 20A of the second embodiment perform substantially the same operation. In the cell-array unit 20A of the second embodiment, however, use of the depletion-type transistors 51 and 52 makes it possible to achieve more stable operation by forming more robust channels in the NMOS transistors 33 and 34.

As is well known, the depletion-type transistors 51 and 52 have a negative threshold voltage. When the unit selection signal US becomes HIGH (VDD), potential of the nodes N1 and N2 increases to the level of VDD since the gate voltages of the depletion-type transistors 51 and 52 are VDD. The voltages of the nodes N1 and N2 are VDD-Vth in the first embodiment whereas the voltages of the nodes N1 and N2 are VDD in the second embodiment. Because of this, higher gate voltage can be supplied to the NMOS transistors 33 and 34. As described above, therefore, more robust channels are formed in the NMOS transistors 33 and 34, thereby achieving more stable operation.

Figure 7:
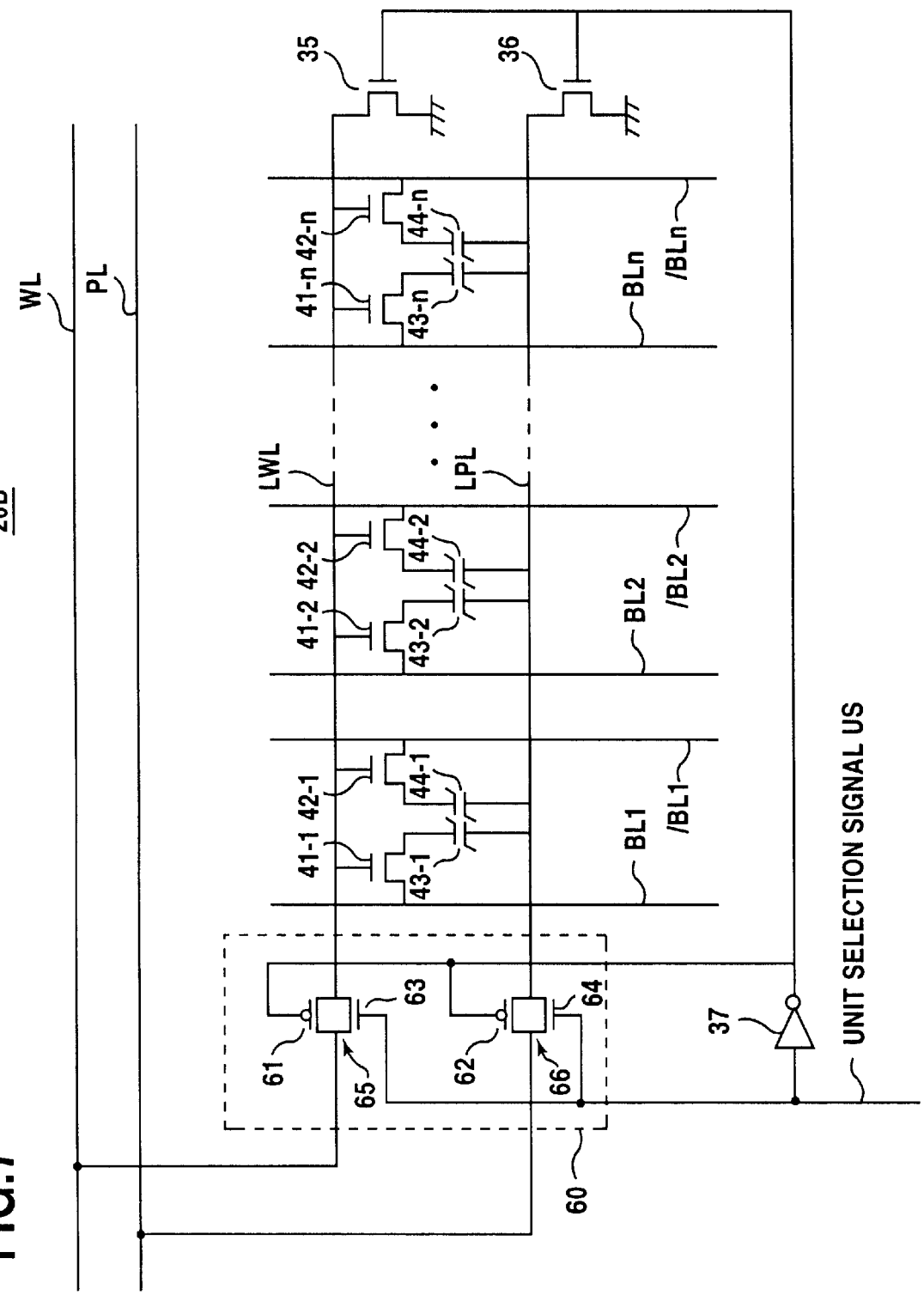
FIG. 7 is a circuit diagram showing a configuration of a third embodiment of the cell array unit.

FIG. 7 is a circuit diagram showing a configuration of a third embodiment of the cell array unit. The circuit diagram of FIG. 7 shows a relevant portion corresponding to a set of a global word line WL and a global plate line PL among the entire configuration of the cell-array unit. The entirety of the cell-array unit is structured by repeating the circuit configuration of FIG. 7 as many as there are global word lines WL and the global plate lines PL. In FIG. 7, the same elements as those of FIG. 3 are referred to by the same numerals, and a description thereof will be omitted.

A cell-array unit 20B of FIG. 7 has the same configuration as the cell-array unit 20 of FIG. 3 with an exception that a unit switch circuit 60 is provided in place of the unit switch circuit 30. The unit switch circuit 60 includes PMOS transistors 61 and 62 and NMOS transistors 63 and 64. The PMOS transistor 61 and the NMOS transistor 63 together form a transfer gate 65, and the PMOS transistor 62 and the NMOS transistor 64 together form a transfer gate 66. Because of use of the PMOS transistor and the NMOS transistor combined together, the transfer gates can couple the global word line WL and the global plate line PL to the local word line LWL and the local plate line LPL, respectively, and can activate the local word line LWL and the local plate line LPL to the same potential as that of the global word line WL and the global plate line PL, respectively.

Figure 8:
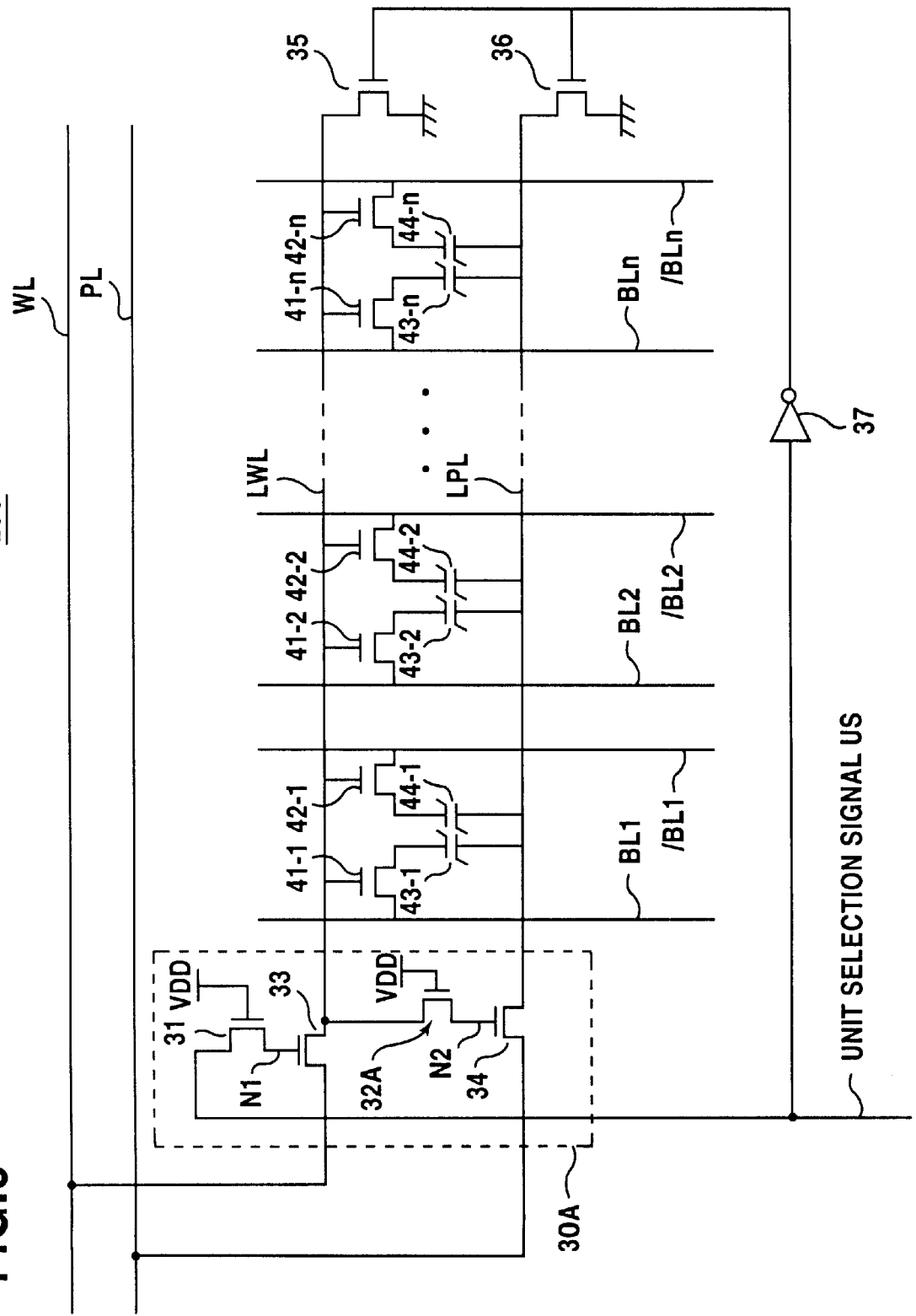
FIG. 8 is a circuit diagram showing a configuration of a fourth embodiment of the cell array unit.
Figure 9:
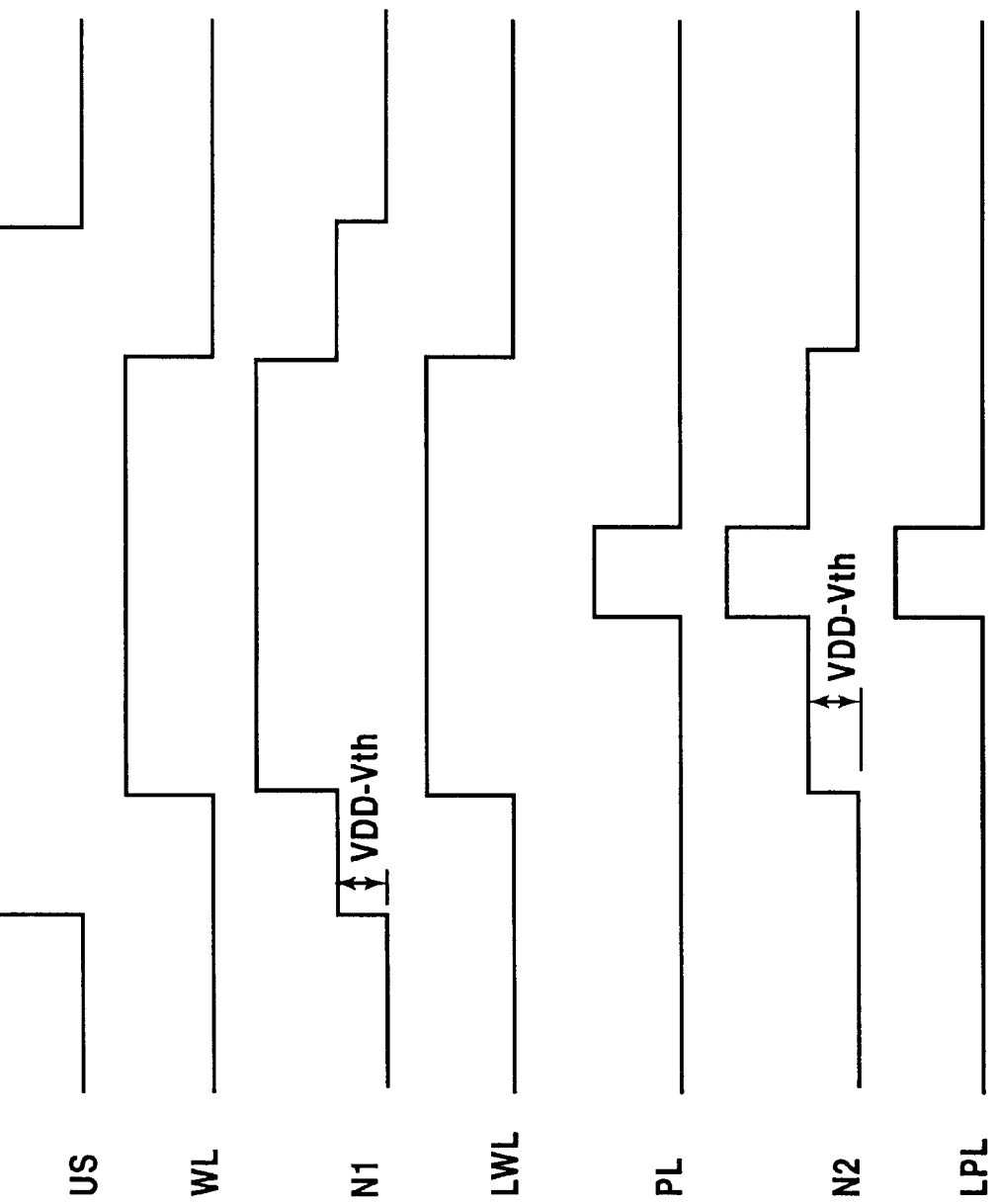
FIG. 9A through FIG. 9G are timing charts for explaining operation of the circuit of FIG. 8.

FIG. 8 is a circuit diagram showing a configuration of a fourth embodiment of the cell array unit. In FIG. 8, the same elements as those of FIG. 3 are referred to by the same numerals, and a description thereof will be omitted.

A cell-array unit 20C of FIG. 8 has the same configuration as the cell-array unit 20 of FIG. 3 with an exception that an NMOS transistor 32A is provided in place of the NMOS transistor 32. The NMOS transistor 32A has the drain node thereof connected to the local word line LWL in stead of being connected to the unit selection signal US. The unit selection signal US supplied to a unit switch circuit 30A becomes HIGH when the cell-array unit 20C is selected. When this happens, the global word line WL is coupled to the local word line LWL. As the local word line LWL is activated, the NMOS transistor 34 becomes conductive, so that the global plate line PL is electrically connected to the local plate line LPL.

FIG. 9A through FIG. 9G show signal levels of the unit selection signal US, the global word line WL, a node N1, the local word line LWL, the global plate line PL, a node N2, and the local plate line LPL.

As can be seen from comparison of Figs. 9A through 9G with FIGS. 4A through 4G, the cell-array unit 20 of the first embodiment and the cell-array unit 20C of the fourth embodiment perform the same operation, except for the activation timing of the node N2. In the cell-array unit 20C of the fourth embodiment, the NMOS transistor 32A is connected to the local word line LWL. Because of this, the voltage level VDD-Vth appears at the node N2 only when the local word line LWL becomes HIGH.

In the cell-array unit 20C of the fourth embodiment, the switch portion of the unit switch circuit 30A relevant to the plate lines is driven by the signal of the local word line LWL rather than by the unit selection signal US. This makes it possible to use the unit selection signal US having relatively small driving power compared to the unit selection signal US used in the first embodiment. Power consumption in the unit selection circuit 19 (see FIG. 2) can thus be reduced. When a plurality of global plate lines PL are taken into consideration, the NMOS transistor 34 in the fourth embodiment becomes conductive only in the switch portion relevant to the plate lines that correspond to the selected word. In switch portions relevant to plate lines that correspond to other word lines, the NMOS transistors 34 are not brought to the conductive state. Accordingly, overall power consumption can be reduced in the fourth embodiment, compared to the first embodiment in which the NMOS transistors 34 become conductive in the switch portions relevant to plate lines that correspond to any word lines.

Figure 10:
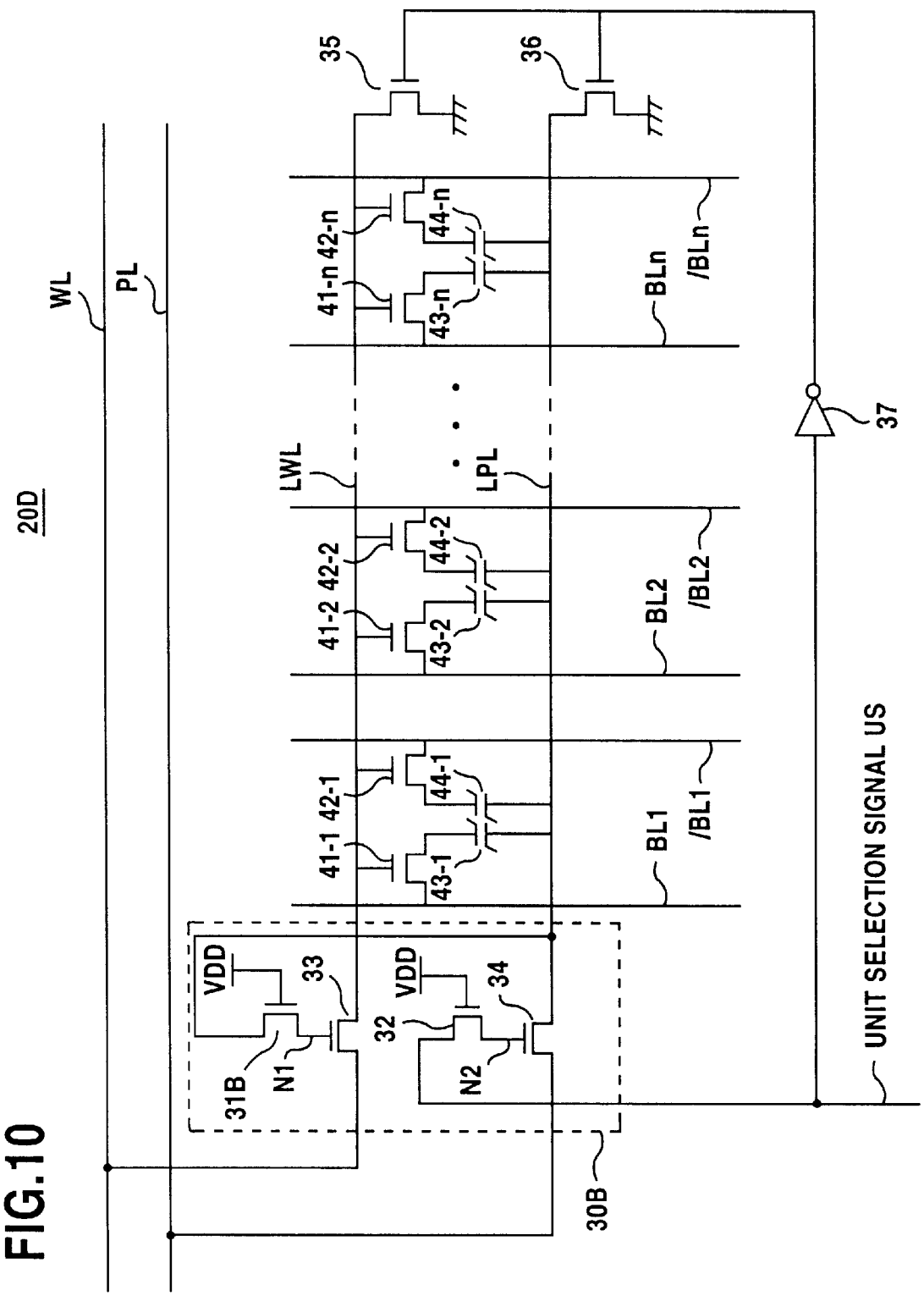
FIG. 10 is a circuit diagram showing a configuration of a fifth embodiment of the cell array unit.

FIG. 10 is a circuit diagram showing a configuration of a fifth embodiment of the cell array unit. In FIG. 10, the same elements as those of FIG. 3 are referred to by the same numerals, and a description thereof will be omitted.

A cell-array unit 20D of FIG. 10 has the same configuration as the cell-array unit 20 of FIG. 3 with an exception that an NMOS transistor 31B is provided in place of the NMOS transistor 31. The NMOS transistor 31B has the drain node thereof connected to the local plate line LPL in stead of being connected to the unit selection signal US. The unit selection signal US supplied to a unit switch circuit 30B becomes HIGH when the cell-array unit 20D is selected. When this happens, the global plate line PL is coupled to the local plate line LPL. As the local plate line LPL is activated, the NMOS transistor 33 becomes conductive, so that the global word line WL is electrically connected to the local word line LWL.

FIG. 11A through FIG. 11G show signal levels of the unit selection signal US, the global word line WL, a node N1, the local word line LWL, the global plate line PL, a node N2, and the local plate line LPL.

As can be seen from comparison of FIGS. 11A through 11G with FIGS. 4A through 4G, the cell-array unit 20 of the first embodiment and the cell-array unit 20D of the fifth embodiment operate differently from each other in terms of the activation timings of the plate lines. In the cell-array unit 20D of the fifth embodiment, the local plate line LPL needs to be in an activated state in order to activate the local word line LWL. To this end, the fifth embodiment activates the global plate line PL at a faster timing than in the first embodiment, and deactivates the global plate line PL at a later timing than in the first embodiment.

In the cell-array unit 20D of the fifth embodiment, the switch portion of the unit switch circuit 30B relevant to the word lines is driven by the signal of the local plate line LPL rather than by the unit selection signal US. This makes it possible to use the unit selection signal US having relatively small driving power compared to the unit selection signal US used in the first embodiment. Power consumption in the unit selection circuit 19 (see FIG. 2) can thus be reduced. When a plurality of global word lines WL are taken into consideration, the NMOS transistor 33 in the fifth embodiment becomes conductive only in the switch portion that corresponds to the selected word. In switch portions that correspond to other word lines, the NMOS transistors 33 are not brought to the conductive state. Accordingly, overall power consumption can be reduced in the fifth embodiment, compared to the first embodiment in which the NMOS transistors 33 become conductive in switch portions that correspond to any word lines.

Figure 12:
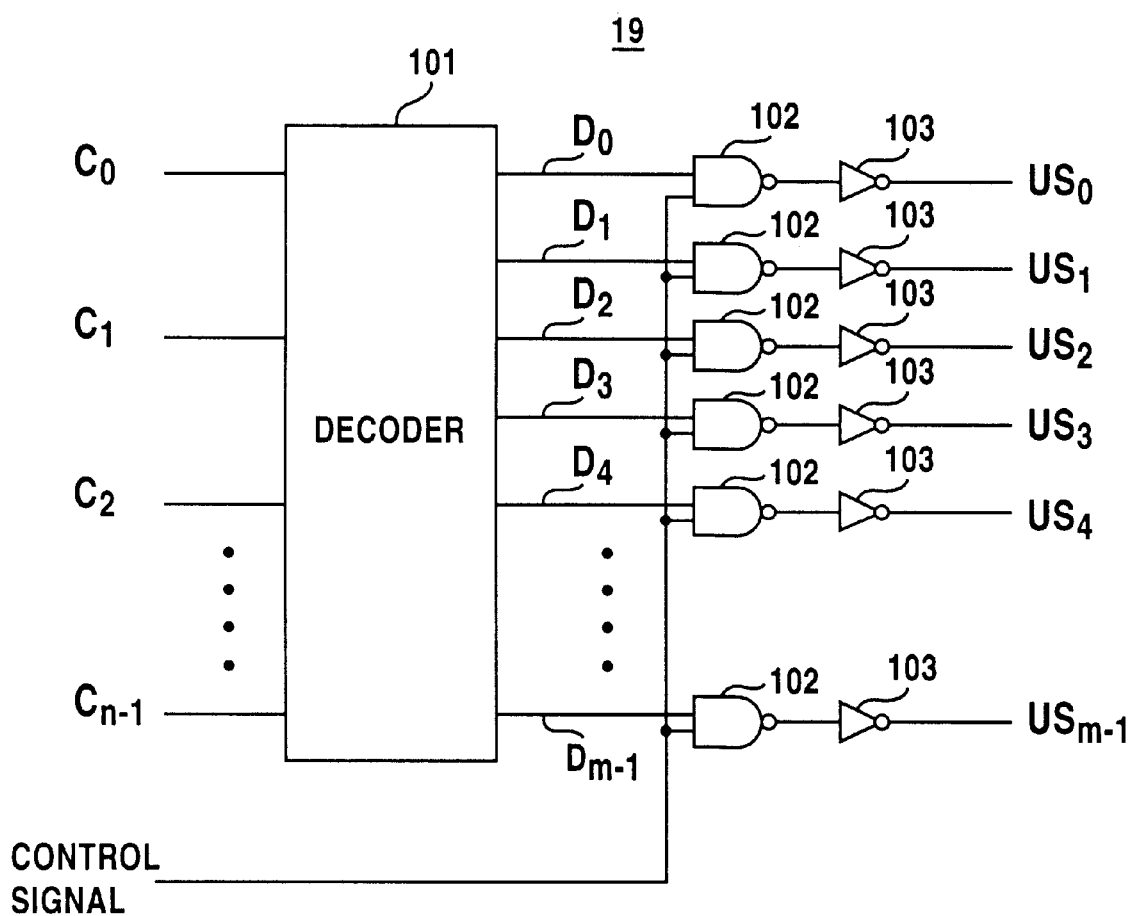
FIG. 12 is a circuit diagram showing a configuration of a unit selection circuit.

FIG. 12 is a circuit diagram showing a configuration of the unit selection circuit 19.

The unit selection circuit 19 of FIG. 12 provides a decoder function to decode a column address, and this is all that is necessary. The unit selection circuit 19 includes a decoder 101, NAND circuits 102, and inverters 103, for example. The decoder 101 receives column address signals C0 through Cn-1, and decodes the signals to supply decoded signals D0 through Dm-1. When n is 8, for example, m is 256. The decoded signals D0 through Dm-1 are subjected to AND logic operation to be combined with a control signal, and, then, are output as unit selection signals US0 through USm-1. The control signal is a timing signal that is supplied from the control unit 13. The control signal defines timing such that the unit selection signals US0 through USm-1 are output at the same timing as the unit selection signal US as shown in FIG. 4A, for example.

As the column address signals C0 through Cn-1, all bits of a column address may be used. Alternatively, only a predetermined number of upper bits of a column address may be used. When all the bits of a column address is used, any given cell-array unit 20 corresponds to a single column address, and the local word line and the local plate line are activated only with respect to memory cells of an accessed column address. When a predetermined number of upper bits of a column address are used, a cell-array unit 20 corresponds to a plurality of column addresses, and the local word line and the local plate line are activated with respect to memory cells of a plurality of column addresses that are positioned around the accessed column address.

In summary, according to the present invention, one or more column addresses constitute a unit, and a local word line is provided for each unit as a dedicated word line. Then, a local word line in a selected unit is connected to a global word line. Further, a local plate line is provided for each unit as a dedicated plate line. Then, a local plate line in the selected unit is connected to a global plate line. This makes it possible to activate a local word line and local plate line only in the selected unit, thereby avoiding excessive power consumption.

In units that are not selected, local word lines and local plate lines are taken care of such that they are not placed in a floating state, thereby insuring reliable operation.

Decode processing of an input column address is all that is necessary to select one of the units.

Channels are created in transistors first, and, then, a global word line and a global plate line are activated to boost the gate voltage of the transistors, so that the gate voltage is raised to a voltage higher than the activated voltage of the global word line and the global plate line. This makes it possible to insure the same potential between the global lines and the local lines.

Use of depletion-type transistors makes it possible to further raise the gate voltages of the transistors, thereby achieving stable high-speed operation.

Use of transfer gates comprised of an NMOS transistor and a PMOS transistor connected in parallel makes it possible to connect local lines to global lines while insuring the same potential therebetween.

A portion of the unit switch circuit relevant to switching of plate lines may be controlled and driven by the signal of a local word line rather than by the unit selection signal. In this configuration, the unit selection signal needs only a relatively small driving power, which results in a reduction of power consumption.

Alternatively, a portion of the unit switch circuit relevant to switching of word lines may be controlled and driven by the signal of a local plate line rather than by the unit selection signal. In this configuration, the unit selection signal needs only a relatively small driving power, which results in a reduction of power consumption.

In the following, a second principle of the present invention will be described.

The present invention generally relates to semiconductor memory devices using ferroelectric, and particularly relates to a ferroelectric semiconductor memory device with a reduced test time required for testing the device.

Data-write operation of FRAMs is substantially the same as that of DRAMs except for control of the plate voltage. Schematically, a word line is activated to make a cell transistor conductive, thereby writing data of the bit lines to a memory cell via the cell transistor, followed by deactivating the word line to make the cell transistor nonconductive after the writing of data. In FRAMs, a plate line is selectively activated simultaneously with activation of the word line, thereby making it possible to write data in the ferroelectric cell.

The ferroelectric cell has parasitic capacitance. When data-write operation is performed, therefore, the parasitic capacitance stores electrical charge therein while the ferroelectric memory function stores the data voltage independently. During normal data-write operation, such electrical charge of the parasitic capacitance is desirable since it tends to augment the memory retention (data-retention capacity) of the ferroelectric memory cell.

DRAMs and FRAMs are tested before product shipment from the factory in order to check the memory retention of each memory cell. Such test is conducted by repeatedly performing data-write operations and data-read operations. Although this test is expected to check the data retention capability of ferroelectric devices, because of presence of parasitic capacitance as described above, the test in reality ends up checking the capability that is resulted from combining the data-retention capability of the ferroelectric and the memory retention capability of the DRAM-like capacitance.

In order to check the data-retention capability of the ferroelectric alone, it is necessary to wait until electrical charge of parasitic capacitance disappears due to natural electrical discharge. In detail, it is necessary to set aside a few seconds to a few minutes for this purpose after the writing of data during the test operation, and, then, data-read operation is carried out after all electrical charge is removed. This is the way the test should be conducted in order to test the data-retention capability that is not affected by the parasitic capacitance.

As the circuit density of semiconductor memory devices increases, an increased test time is necessary. If there is a need to set aside a wait time during the test operation, the test time becomes prohibitively lengthy.

Accordingly, there is a need for an FRAM with a reduced test time.

In the following, embodiments of the present invention will be described with reference to the accompanying drawings.

Figure 13:
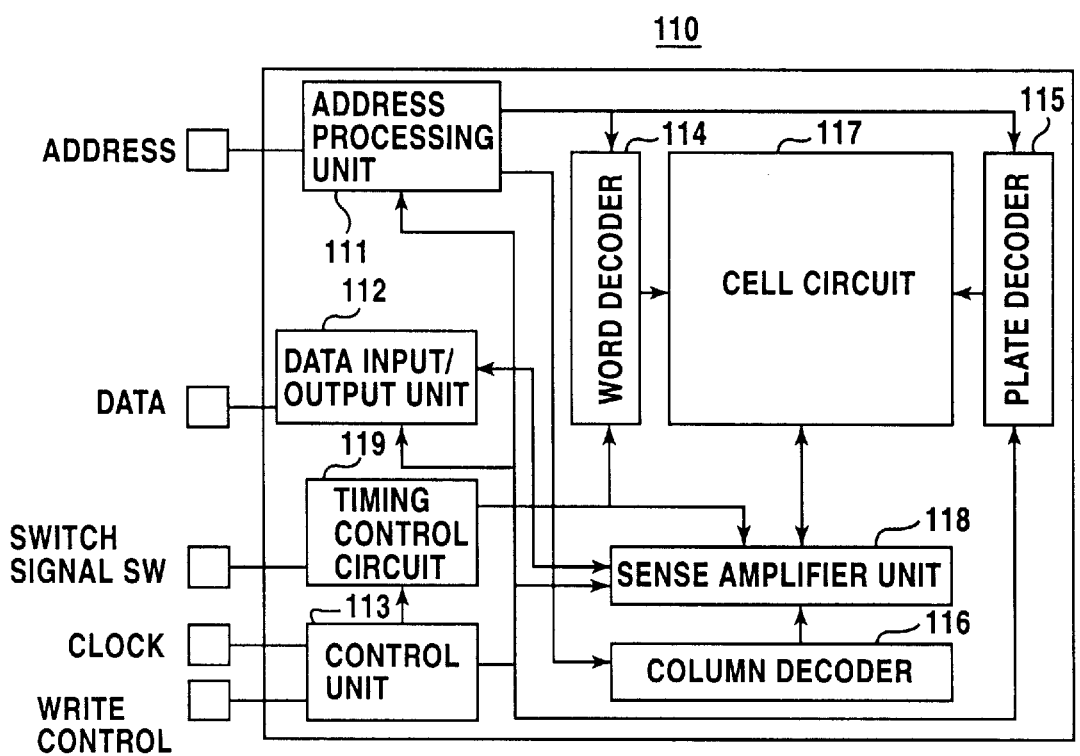
FIG. 13 is a ferroelectric semiconductor memory device to which the present invention is applied.

FIG. 13 is a ferroelectric semiconductor memory device to which the present invention is applied.

An FRAM 110 of FIG. 13 includes an address processing unit 111, a data input/output unit 112, a control unit 113, a word decoder 114, a plate decoder 115, a column decoder 116, a cell circuit 117, a sense amplifier unit 118, and a timing control circuit 119.

The cell circuit 117 includes a plurality of cells arranged in a matrix form where the cells are based on ferroelectric memory devices. Further, the cell circuit 117 includes circuitry and wires used for specifying addresses, amplifying data, and so on when data is read from or written in each cell.

The address processing unit 111 is comprised of circuits such as address buffers, address pre-decoders, and so on. The address processing unit 111 receives address signals from an exterior of the device, and supplies the address signals to the word decoder 114, the plate decoder 115, and the column decoder 116 at appropriate timings.

The data input/output unit 112 is comprised of circuits such as data buffers, and supplies data to the sense amplifier unit 118 at appropriate timings as the data is received from the exterior of the device. Further, the data input/output unit 112 outputs data to the exterior of the device at appropriate timings as the data is read from the cell circuit 117 via the sense amplifier unit 118. The sense amplifier unit 118 amplifies the data to be written, and supplies the amplified data to the cell circuit 117. Also, the sense amplifier unit 118 amplifies data read from the cell circuit 117.

The control unit 113 includes circuits such as control-signal buffers, a command decoder, etc., and receives control signals and a clock signal from the exterior of the device. The control unit 113 decodes a command represented by the control signals, and controls operation and timing of each circuit unit provided in the FRAM 110. Namely, the control unit 113 supplies clock signals and timing signals to each circuit unit of the FRAM 110, so that each circuit unit operates at appropriate timing, thereby achieving data-read/data-write operation of the FRAM 110. In FIG. 13, only the write-control signal is shown as an example of the control signals.

The word decoder 114 decodes a row address supplied from the address processing unit 111, and selectively activates a word line corresponding to the row address. As a result, cell transistors connected to the activated word line become conductive, so that data-read/data-write operation is conducted with respect to the memory cells of the selected word address.

The plate decoder 115 decodes the row address supplied from the address processing unit 111, and selectively activates a plate line corresponding to the row address. In FRAMs, data writing is carried out by applying a HIGH voltage to a node of a ferroelectric device connected to the plate line while applying a data voltage of either HIGH or LOW to the other node of the ferroelectric device. Concurrently with the word selection by the word line, the plate line is selectively activated at a position corresponding to the activated word line, thereby achieving data writing in the selected memory cells.

The column decoder 116 decodes a column address supplied from the address processing unit 111, and selectively activates a column line corresponding to the column address. As a result, a corresponding column transistor becomes conductive, connecting a corresponding sense amplifier of the sense amplifier unit 118 to the data input/output unit 112.

In the case of data-read operation, data are read from memory cells connected to the activated word line, and appear on bit lines. The sense amplifier unit 118 then amplifies the data on the bit lines. The amplified data is read from a sense amplifier corresponding to the activated column line, and is supplied to the data input/output unit 112. In the case of data-write operation, in the manner reverse to the data-read operation, data is supplied from the data input/output unit 112 to a sense amplifier that is selected by the activated column line. When a word line is activated, a memory cell connected to the activated word line receives data through bit lines from the sense amplifier unit 118.

The timing control circuit 119 is a circuit specific to the present invention, and controls timings of word-line activation and bit-line precharge operation in response to a switch signal SW.

Figure 14:
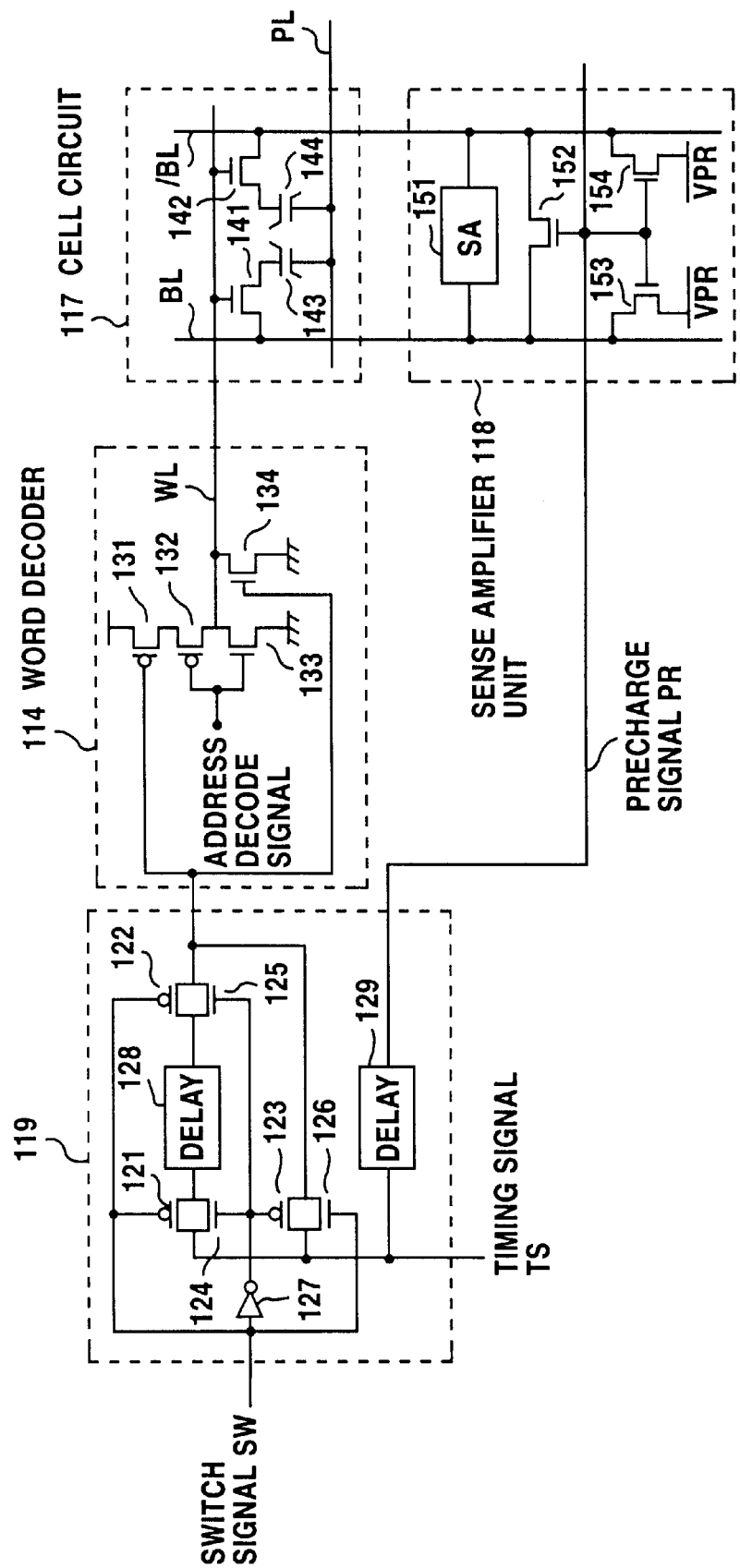
FIG. 14 is a circuit diagram showing a configuration for controlling timings of word-line activation and bit-line precharge operation.

FIG. 14 is a circuit diagram showing a configuration for controlling timings of word-line activation and bit-line precharge operation.

In FIG. 14, the timing control circuit 119 includes PMOS transistors 121 through 123, NMOS transistors 124 through 126, an inverter 127, and delay circuits 128 and 129. The timing control circuit 119 receives a switch signal SW from an exterior of the FRAM 110, and receives a timing signal TS from the control unit 113.

The timing control circuit 119 uses the delay circuit 129 to delay the timing signal TS by a predetermined time delay, and supplies the resultant signal to the sense amplifier unit 118 as a precharge signal PR. When the switch signal SW is HIGH, a transfer gate comprised of the PMOS transistor 123 and the NMOS transistor 126 allows passage of the timing signal TS, which is thus supplied to the word decoder 114. Further, when the switch signal SW is LOW, the timing signal TS is supplied to the word decoder 114 via a transfer gate comprised of the PMOS transistor 121 and the NMOS transistor 124, the delay circuit 128, and a transfer gate comprised of the PMOS transistor 122 and the NMOS transistor 125. Accordingly, the timing of the signal supplied to the word decoder 114 is further delayed when the switch signal SW is LOW, compared to when the switch signal SW is HIGH.

The word decoder 114 includes PMOS transistors 131 and 132 and NMOS transistors 133 and 134. FIG. 14 shows only a portion of the word decoder 114 that is relevant to a single word line WL. When an address corresponding to the word line WL shown in FIG. 14 is specified, the address decode signal that is based on negative logic becomes LOW, so that the PMOS transistor 132 becomes conductive, and the NMOS transistor 133 becomes nonconductive. When this happens, the signal supplied from the timing control circuit 119 is LOW, so that the PMOS transistor 131 is conductive, and the NMOS transistor 134 is nonconductive. The word line WL is thus HIGH in this case. Thereafter, the signal from the timing control circuit 119 becomes HIGH, so that the PMOS transistor 131 becomes nonconductive, and the NMOS transistor 134 becomes conductive. As a result, the word line WL returns to the LOW level. Namely, the HIGH pulse supplied from the timing control circuit 119 activates the word line WL.

The word line WL extends into the cell circuit 117. The cell circuit 117 includes NMOS transistors 141 and 142 and memory cells 143 and 144, which are comprised of ferroelectric. The cell circuit 117 shown in FIG. 14 shows only a portion corresponding to a single pair of memory cells. Gates of the NMOS transistors 141 and 142 are connected to the word line WL. When the word line WL is activated, the data of the memory cells 143 and 144 appear on bit lines BL and /BL. Each of the memory cells 143 and 144 has a node thereof connected to a plate line PL.

The sense amplifier unit 118 includes NMOS transistors 152 through 154 and a sense amplifier 151. The sense amplifier unit 118 of FIG. 14 shows only a portion that corresponds to a single sense amplifier. When the precharge signal PR from the timing control circuit 119 becomes HIGH, the NMOS transistors 153 and 154 become conductive, so that the bit lines BL and /BL are precharged to the precharge potential that is equal to the ground voltage.

In the case of write operation, the word line WL is activated to make the NMOS transistors 141 and 142 conductive, so that the data on the bit lines are written in the memory cells 143 an 144.

The switch signal SW is HIGH in the case of normal write operation. The word line WL is thus deactivated before the precharge signal PR becomes HIGH. In this case, therefore, the parasitic capacitance of the memory cells 143 and 144 store electrical charge therein corresponding to the voltage levels of the bit lines. This has an effect of improving the data-retention capacity of the memory cells 143 and 144.

In the case of write operation during the test operation, on the other hand, the switch signal is set to LOW. Because of this, the precharge signal PR becomes HIGH before the word line WL is deactivated. In this case, the bit lines BL and /BL are precharged, and the voltage levels of the bit lines BL and /BL are changed to the ground voltage while the word line WL is in an activated state and the NMOS transistors 141 and 142 are conductive. As a result, the parasitic capacitance of the memory cells 143 and 144 do not store electrical charge therein. An immediately following data-read operation can thus test the data-retention capability of the memory cells 143 and 144 alone. There is no need to set aside a wait time after the data-write operation and before the data-read operation, being different from the case of the related-art test operation. This makes it possible to quickly conduct the memory cell test.

Figure 15:
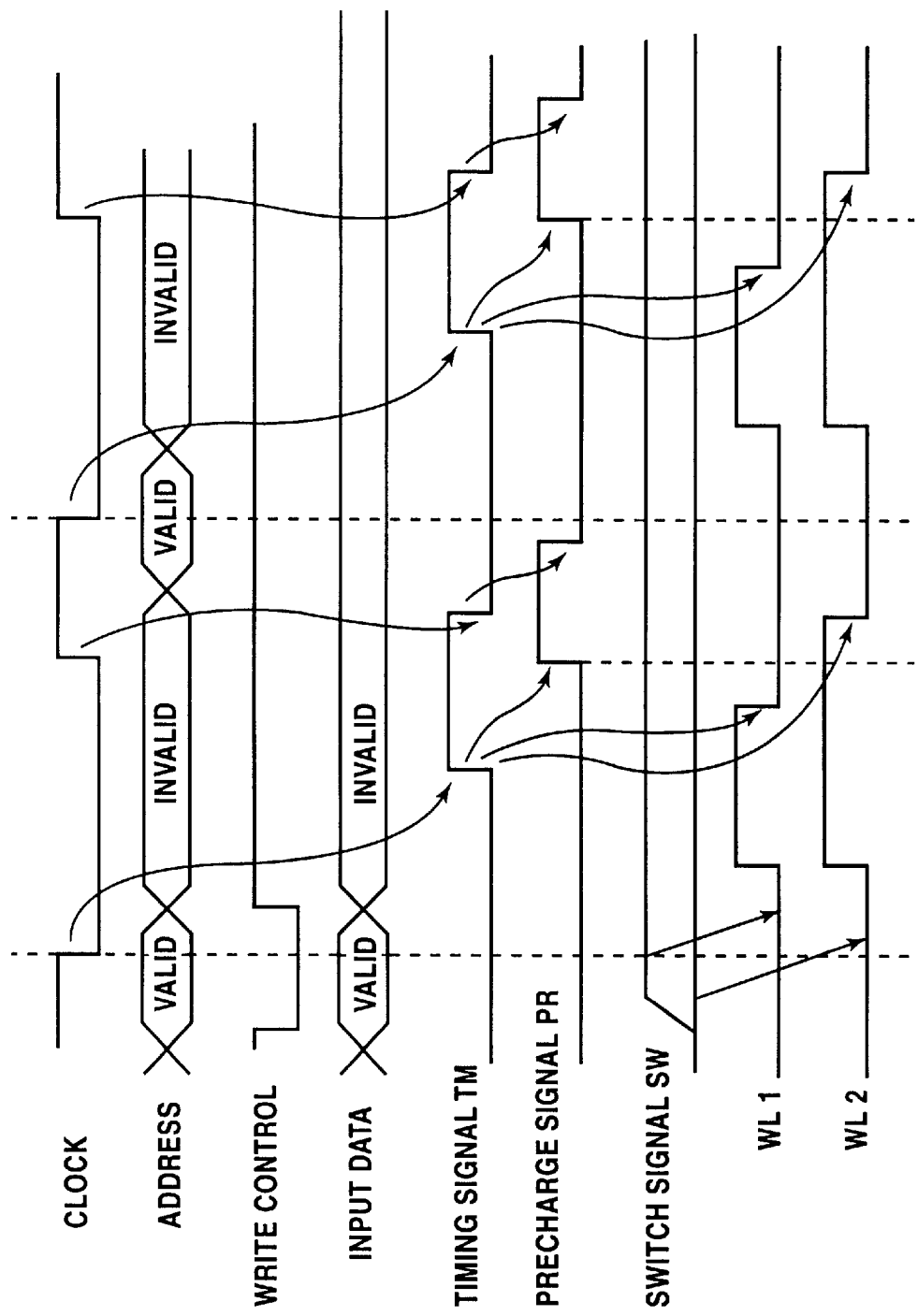
FIG. 15 is a timing chart for explaining operation of controlling the timings of word-line activation and bit-line precharge operation.

FIG. 15 is a timing chart for explaining operation of controlling the timings of word-line activation and bit-line precharge operation.

At a falling edge of the clock signal, write data and write address are input, and a write-control signal indicative of write operation is changed to LOW. As a result, data is written during the first cycle shown in FIG. 15. The timing signal is generated by the control unit 113 based on the clock signal, and is delayed from a rising edge of the clock signal by a predetermined time delay. The timing signal is supplied to the timing control circuit 119, which then generates the precharge signal PR and the signal for deactivating a word line as described in connection with FIG. 14.

As previously described, the timing of deactivation of the word line WL varies depending on HIGH or LOW of the switch signal SW. As shown in FIG. 15 as a word-line signal WL2, when the switch signal SW is LOW, the word line WL maintains an activated state thereof for a certain time period even after the precharge signal PR becomes HIGH. By setting the switch signal SW to LOW during test operation, therefore, ferroelectric memory cells can prevent electrical charge from being accumulated in parasitic capacitance. As shown as a word-line signal WL1, when the switch signal SW is HIGH, the word line WL is deactivated before the commencement of precharge operation. This augments the memory-retention capability of memory cells by building up electrical charge in the parasitic capacitance.

In the embodiment described above, the timing of precharge operation is fixed, and the timing of word-line deactivation is changed. That is, the timing at which cell transistors are changed to a nonconductive state is adjusted. Alternatively, the timing at which the precharge signal PR becomes HIGH may be changed while fixing the timing of word-line deactivation. Namely, the timing of commencement of precharge operation may be adjusted.

Figure 16:
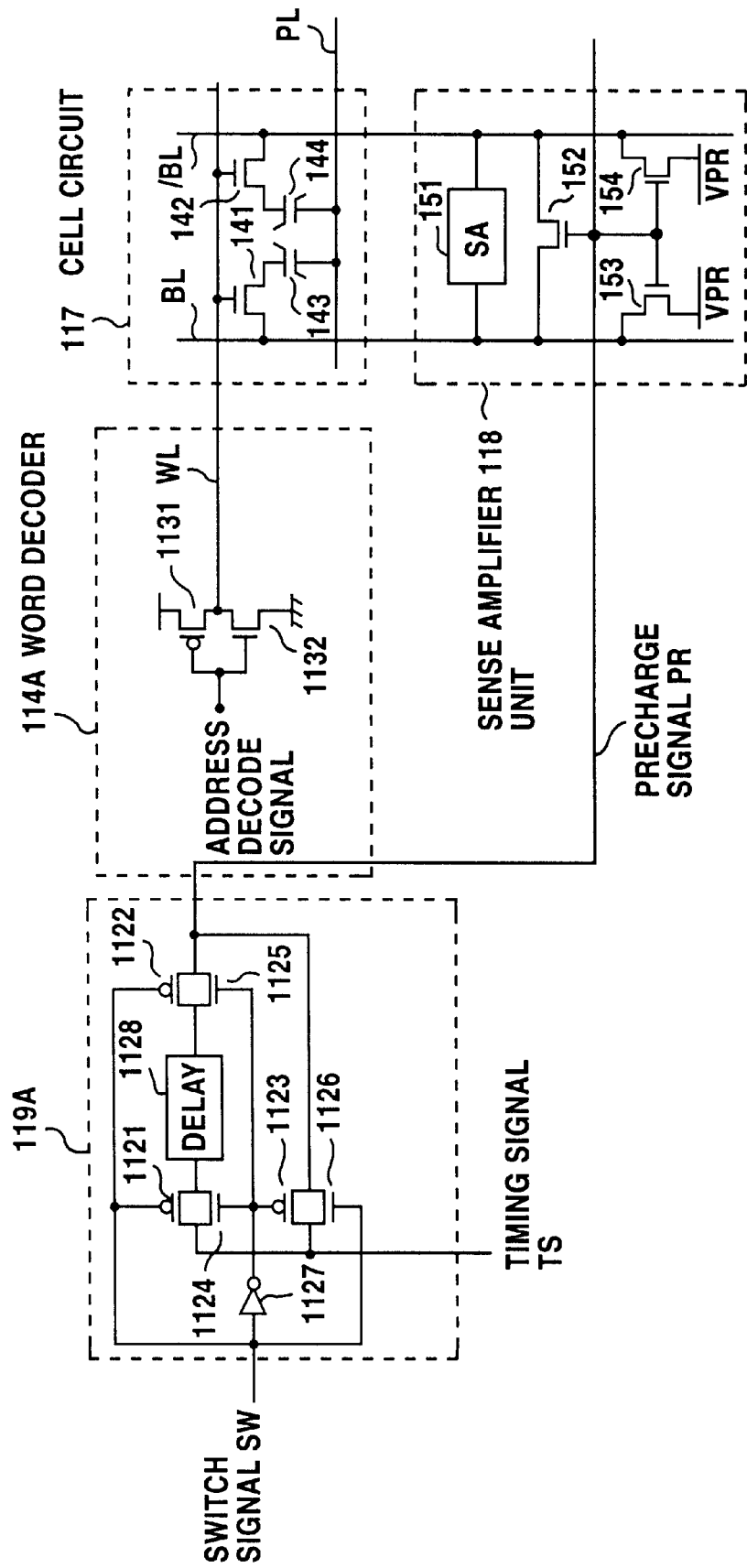
FIG. 16 is a circuit diagram of an embodiment in which the timing of word-line deactivation is fixed while the timing of a precharge signal is changed.

FIG. 16 is a circuit diagram of an embodiment in which the timing of word-line deactivation is fixed while the timing of a precharge signal is changed. In FIG. 16, the same elements as those of FIG. 14 are referred to by the same numerals, and a description thereof will be omitted.

A timing control circuit 119A shown in FIG. 16 includes PMOS transistors 1121 through 1123, NMOS transistors 1124 through 1126, an inverter 1127, and a delay circuit 1128.

The timing control circuit 1119A receives a switch signal SW from an exterior of the FRAM 110, and receives a timing signal TS from the control unit 113.

When the switch signal SW is HIGH, the timing control circuit 119A supplies the timing signal TS to the sense amplifier unit 118 as a precharge signal PR via a transfer gate comprised of the PMOS transistor 1123 and the NMOS transistor 1126. When the switch signal SW is LOW, the timing signal TS is supplied as the precharge signal PR to the sense amplifier unit 118 via a transfer gate comprised of the PMOS transistor 1121 and the NMOS transistor 1124, the delay circuit 1128, and a transfer gate comprised of the PMOS transistor 1122 and the NMOS transistor 1125. Accordingly, the timing at which the precharge signal PR becomes HIGH is further delayed when the switch signal SW is LOW, compared to when the switch signal SW is HIGH.

The word decoder 114A includes a PMOS transistor 1131 and an NMOS transistor 1132. FIG. 16 shows only a portion of the word decoder 114A that is relevant to a single word line WL. When an address corresponding to the word line WL shown in FIG. 16 is specified, the address decode signal that is based on negative logic becomes LOW, so that the PMOS transistor 1131 becomes conductive, and the NMOS transistor 1132 becomes nonconductive. The word line WL thus becomes HIGH. Thereafter, the address decode signal returns to the HIGH level, so that the PMOS transistor 1131 becomes nonconductive, and the NMOS transistor 1132 becomes conductive. As a result, the word line WL returns to the LOW level. Namely, in the configuration of FIG. 16, the timing of word-line activation and the timing of word-line deactivation are dependent on the address decode signal, and is fixed regardless of the switch signal SW.

In the configuration of FIG. 16, the cell circuit 117 and the sense amplifier unit 118 have the same circuit structures as those shown in FIG. 14.

Figure 17:
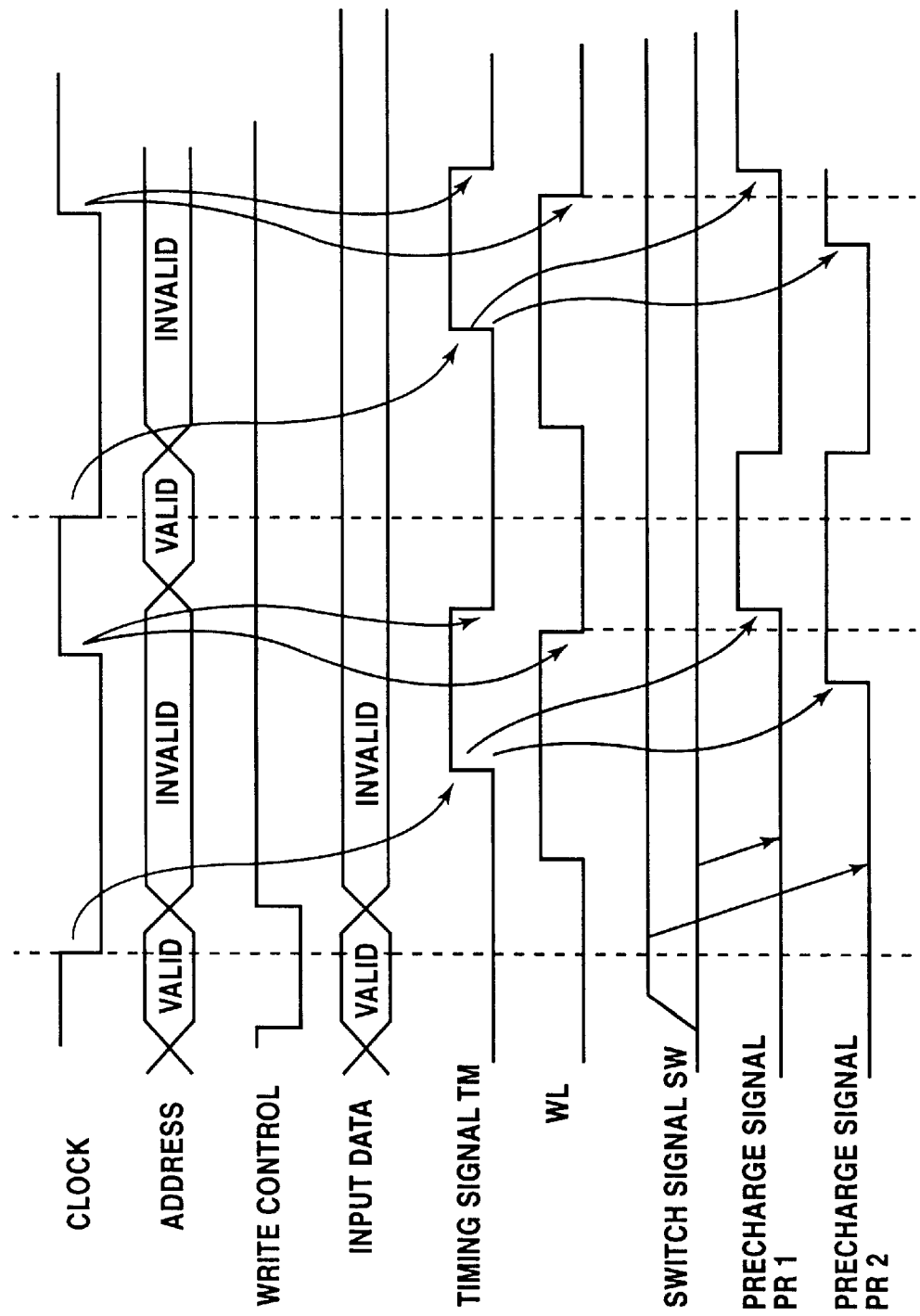
FIG. 17 is a timing chart for explaining operation of controlling the timing of bit-line precharge operation while keeping fixed the timing of word-line activation.

FIG. 17 is a timing chart for explaining operation of controlling the timing of bit-line precharge operation while keeping fixed the timing of word-line activation.

At a falling edge of the clock signal, write data and write address are input, and a write-control signal indicative of write operation is changed to LOW. As a result, data is written during the first cycle shown in FIG. 17. The timing signal is generated by the control unit 113 based on the clock signal, and is delayed from a rising edge of the clock signal by a predetermined time delay. The timing signal is supplied to the timing control circuit 119, which then generates the precharge signal PR as described in connection with FIG. 16.

As previously described, the timing of deactivation of the word line WL varies depending on HIGH or LOW of the switch signal SW. As shown in FIG. 17 as a precharge signal PR1, when the switch signal SW is LOW, the precharge operation starts after the word line WL is deactivated. With the switch signal SW being LOW, therefore, deactivation of the word line WL prior to the commencement of precharge operation can augment the memory-retention capability of memory cells by accumulating electrical charge in parasitic capacitance. As shown as a precharge signal PR2, when the switch signal SW is set to HIGH during the test operation, the precharge operation starts before the deactivation of the word line. This can prevent electrical charge from being built up in the parasitic capacitance of ferroelectric memory cells.

As described in connection with FIG. 14 and FIG. 16, one or more delay circuits are used in the timing control circuit 119 and in the timing control circuit 119A. These delay circuits may be formed by using a Schmitt circuit or by connecting a plurality of inverters in series. These circuits may be configured such that rising edges and falling edges of an input signal experience respective different delays. For example, the gate widths of PMOS transistors and NMOS transistors that are used in the inverters forming a delay circuit may be properly adjusted to provide different delays between the rising edges and the falling edges. By the same token, the gate lengths of the PMOS transistors and the NMOS transistors may be properly adjusted.

Semiconductor memory devices may be provided as single memory chips, or may be provided as single packages in which a semiconductor memory device and a control circuit chip such as a CPU chip are combined. In such a configuration, it is often impossible to directly access pins of the semiconductor memory device from outside the package. That is, only the control circuit such as a CPU can control the semiconductor memory device. In consideration of this, it is preferable to provide a test circuit inside the semiconductor memory device rather than provide a terminal to which the switch signal SW is supplied. With a test circuit inside the semiconductor memory device, the control device such as a CPU can be used to control the operation of the test circuit.

Figure 18:
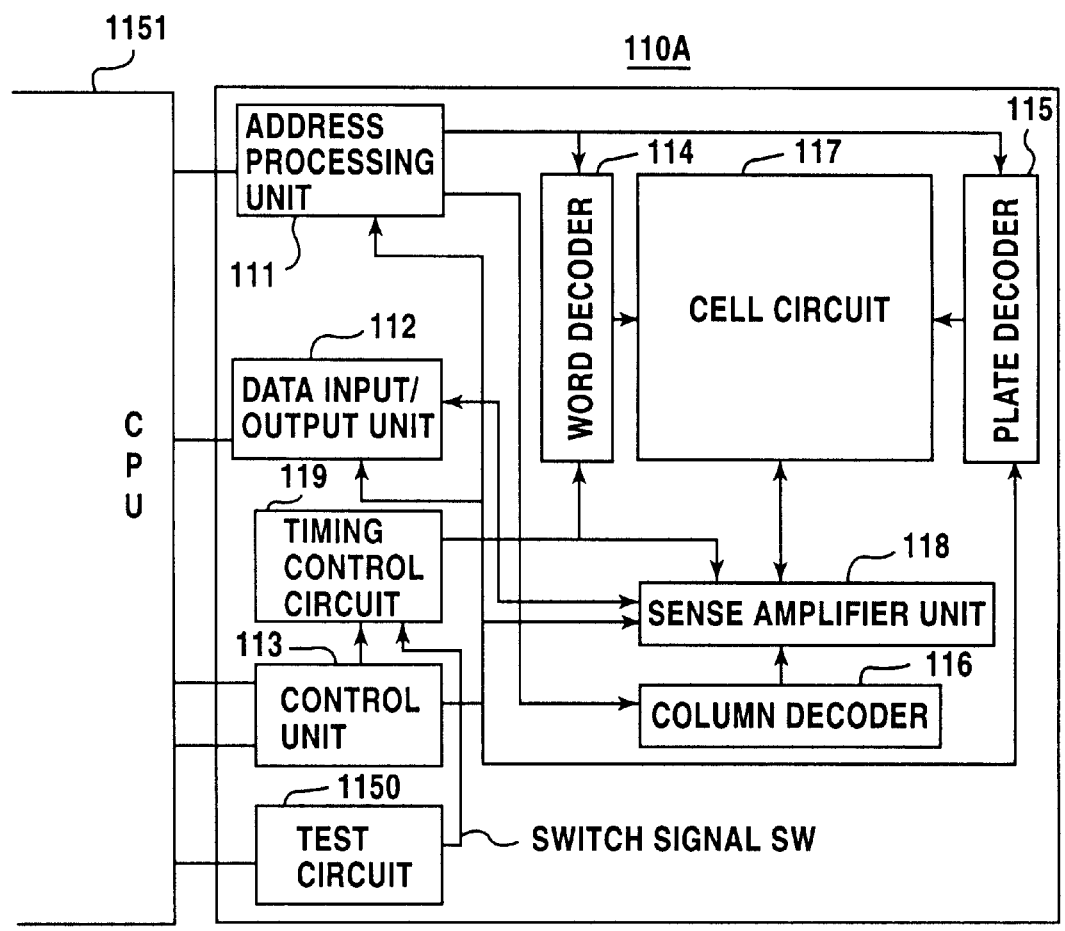
FIG. 18 is a block diagram of an FRAM that is connected to a control circuit such as a CPU according to the present invention.

FIG. 18 is a block diagram of an FRAM that is connected to a control circuit such as a CPU according to the present invention. In FIG. 18, the same elements as those of FIG. 13 are referred to by the same numerals, and a description thereof will be omitted.

FRAM 110A of FIG. 18 includes a test circuit 1150 in addition to the configuration of FIG. 13. The timing control circuit 119 is not provided with a terminal pin that receives a signal from an exterior of the FRAM 110A, and instead receives the switch signal SW from the test circuit 1150.

The test circuit 1150 controls the test operation of the FRAM 110A according to instruction from a CPU 1151 connected to the FRAM 110A. Test circuits per se are employed in conventional DRAMs, and are not specific to the present invention. In the present invention, however, the test circuit 1150 is configured to output the switch signal SW in response to an instruction from the CPU 1151. The switch signal SW assumes either HIGH or LOW as was previously described. Generation of the switch signal SW only requires technology to decode signals supplied from the CPU 1151. A description will be omitted here with regard to the configuration of the test circuit 1150 for generating the switch signal SW.

In the FRAM 110A of FIG. 18, the circuit structure as shown in FIG. 14 or FIG. 16 may be used in order to control the timing of word-line deactivation or the timing of start of a precharge signal in accordance with the test signals.

In the embodiments as described above, the timing of word-line deactivation is adjusted while the timing of precharge operation is fixed, or the timing of precharge operation is adjusted while the timing of word-line deactivation is fixed. In device test, however, there is a case in which it is desired to conduct a test by setting operation timing of word lines to the same conditions as those of the normal write operation, or there is a case in which it is desirable to conduct a test by setting timing of precharge operation to the same conditions as those of the normal write operation, for example.

Accordingly, there is a need to provide a mechanism for selecting a desired write-operation mode during test operation. With such a mechanism, a choice can be made during the test operation to select a mode in which the timing of word-line deactivation is adjusted while the timing of precharge operation is fixed, or to select a mode in which the timing of precharge operation is adjusted while the timing of word-line deactivation is fixed.

Figure 19:
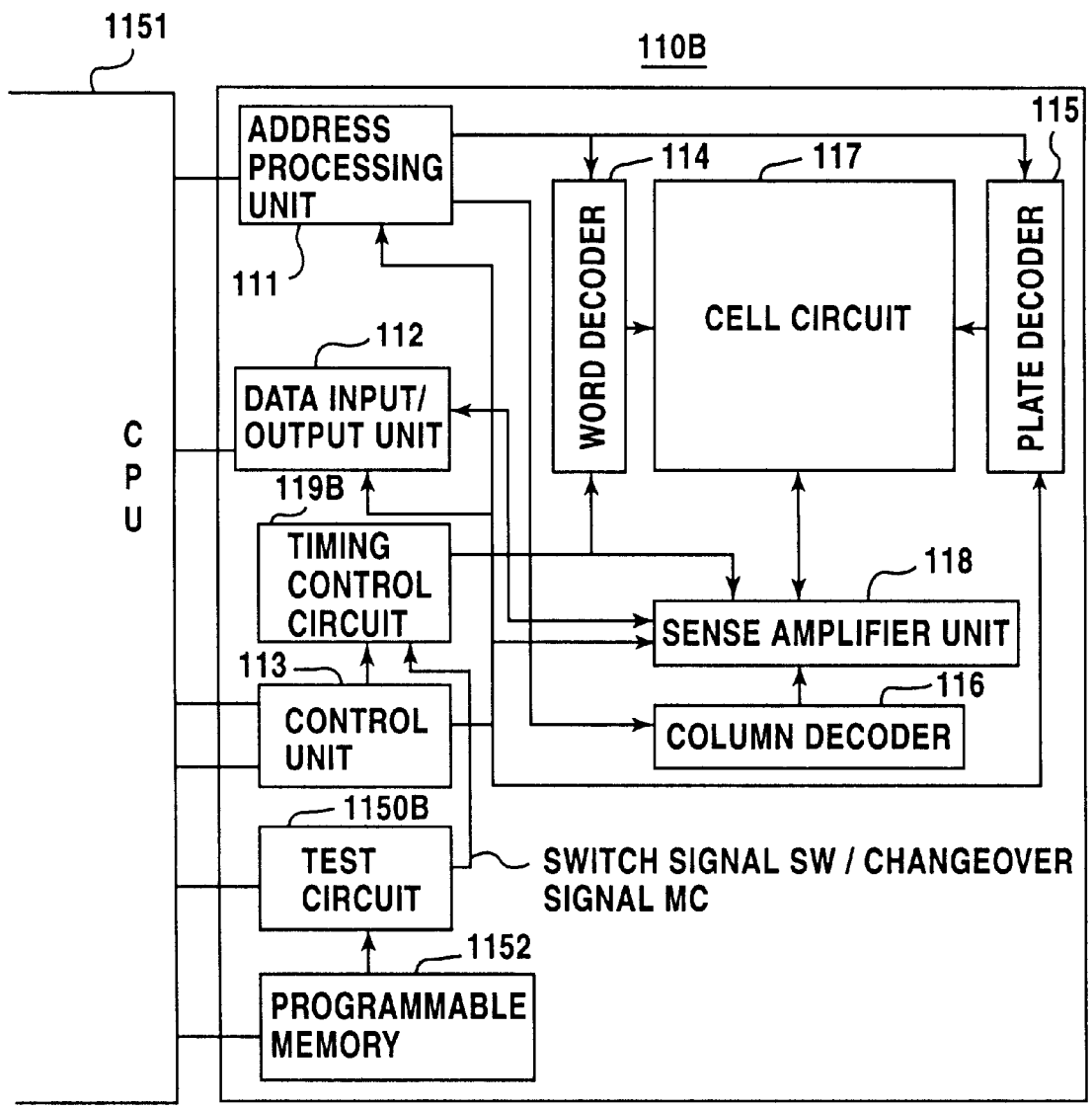
FIG. 19 is a block diagram of an FRAM that is connected to a control circuit such as a CPU according to the present invention.

FIG. 19 is a block diagram of an FRAM that is connected to a control circuit such as a CPU according to the present invention. In FIG. 19, the same elements as those of FIG. 18 are referred to by the same numerals, and a description thereof will be omitted.

In an FRAM 110B of FIG. 19, a timing control circuit 119B and a test circuit 1150B are provided to replace the corresponding circuits of FIG. 18, and a programmable memory 1152 is newly provided. The programmable memory 1152 is programmed according to instruction from the CPU 1151. In the configuration of FIG. 19, the programmable memory 1152 is used to select a mode in which the timing of word-line deactivation is adjusted while the timing of precharge operation is fixed, or to select a mode in which the timing of precharge operation is adjusted while the timing of word-line deactivation is fixed. In practice, therefore, the programmable memory 1152 needs to store only one bit of information indicative of which operation mode is selected according to the instruction from the CPU 151, and can be a quite simple register.

The programmable memory 1152 supplies a signal to the test circuit 1150B where the signal indicates which operation mode is selected. The test circuit 1150B supplies the switch signal SW and a changeover signal MC indicative of the selected operation mode to the timing control circuit 119B. Alternatively, the changeover signal MC may be directly supplied to the timing control circuit 119B from the programmable memory 152.

Figure 20:
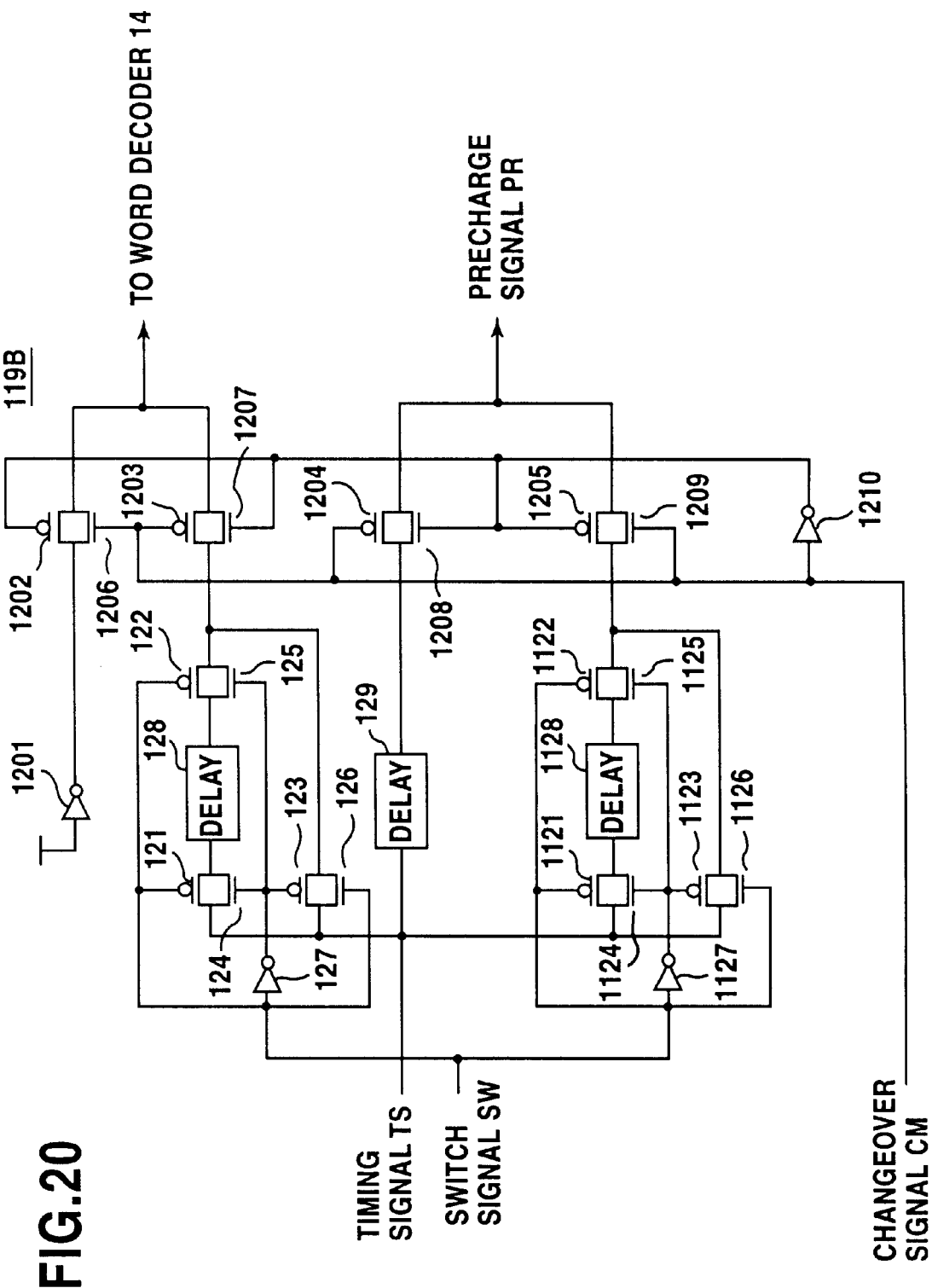
FIG. 20 is a circuit diagram of a timing control circuit which switches between the adjustment of word-line activation timing and the adjustment of precharge-operation timing according to a changeover signal.

FIG. 20 is a circuit diagram of the timing control circuit which switches between the adjustment of word-line activation timing and the adjustment of precharge-operation timing according to the changeover signal.

The timing control circuit 119B of FIG. 20 includes the PMOS transistors 121 through 123, the NMOS transistors 124 through 126, the inverter 127, and the delay circuits 128 and 129, all of which correspond to the timing control circuit 119 of FIG. 14, and further includes the PMOS transistors 1121 through 1123, the NMOS transistors 1124 through 1126, the inverter 1127, and the delay circuit 1128, which correspond to the timing control circuit 119A of FIG. 16. The timing control circuit 119B further includes an inverter 1201, PMOS transistors 1202 through 1205, NMOS transistors 1206 through 1209, and an inverter 1210.

When the changeover signal CM is LOW, a transfer gate comprised of the PMOS transistor 1203 and the NMOS transistor 1207 is opened, so that a signal from the circuit portion corresponding to the timing control circuit 119 is supplied to the word decoder 114 shown in FIG. 14. Also, a transfer gate comprised of the PMOS transistor 1204 and the NMOS transistor 1208 is opened, so that a precharge signal PR from the circuit portion corresponding to the timing control circuit 119 is supplied to the sense amplifier unit 118.

In this manner, when the changeover signal CM is LOW, the timing of precharge operation is fixed, and the timing of word-line deactivation varies depending on the switch signal SW.

When the changeover signal CM is HIGH, a transfer gate comprised of the PMOS transistor 1202 and the NMOS transistor 1206 is opened, so that a signal fixed to the LOW level is supplied to the word decoder 114 shown in FIG. 14. Also, a transfer gate comprised of the PMOS transistor 1205 and the NMOS transistor 1209 is opened, so that a precharge signal PR from the circuit portion corresponding to the timing control circuit 119A is supplied to the sense amplifier unit 118.

In this manner, when the changeover signal CM is HIGH, the timing of word-line operation is fixed, and the timing of precharge operation varies depending on the switch signal SW.

In summary, according to the present invention, the word-line driving circuits and the precharge circuits are controlled so as to deactivate a word line after commencement of precharge operation in the second mode. When the cell transistors become nonconductive, therefore, the data voltages are already removed from the bit lines, so that the parasitic capacitance of the memory cells do not store electrical charge therein. An immediately following data-read operation can thus test the data-retention capability of the memory cells alone. There is no need to set aside a wait time after the data-write operation and before the data-read operation, being different from the case of the related-art test operation. This makes it possible to quickly conduct the memory cell test.

A switch signal may be provided to an external pin of the semiconductor memory device, and may be changed in terms of a signal level thereof between the normal operation mode and the test operation mode. This makes it possible to switch between a mode in which a word line is deactivated before commencement of precharge operation and a mode in which a word line is deactivated after commencement of precharge operation.

Semiconductor memory devices may be provided as single packages in which a semiconductor memory device and a control circuit chip such as a CPU chip are combined, and it may not be possible to make direct access from outside a package to pins of the semiconductor memory device. In such a configuration, a test circuit may be provided inside the semiconductor memory device to supply a switch signal, so that the control device such as a CPU can be used to control the operation of the test circuit, thereby switching between a mode in which a word line is deactivated before commencement of precharge operation and a mode in which a word line is deactivated after commencement of precharge operation.

It is possible to conduct test of memory cells under the conditions identical to those of normal operation in terms of timing of precharge operation. Alternatively, it is possible to conduct test of memory cells under the conditions identical to those of normal operation in terms of timing of activation and deactivation of word lines.

Further, the semiconductor memory device may be configured to switch between a case in which timing of word line operation is identical to that of normal write operation and a case in which timing of precharge operation is identical to that of normal write operation.

Further, the present invention is not limited to these embodiments, but various variations and modifications may be made without departing from the scope of the present invention.

The present application is based on Japanese priority applications No. 2000-085318 filed on Mar. 24, 2000 and No. 2000-092226 filed on Mar. 29, 2000 with the Japanese Patent Office, the entire contents of which are hereby incorporated by reference.

What is claimed is:

1. A semiconductor memory device, comprising:
   ferroelectric memory cells;
   cell transistors connected between first nodes of said memory cells and data transfer lines, said memory cells and said cell transistors being grouped into units each corresponding to one or more column addresses;
   global word lines, one of which is activated in response to selection of a corresponding row address;
   global plate lines, one of which is activated in response to selection of the corresponding row address;
   local word lines, each of which is provided and dedicated for a corresponding one of said units, and is connected to gates of the cell transistors;
   local plate lines, each of which is provided and dedicated for a corresponding one of said units, and is connected to second nodes of the memory cells; and
   a unit switch circuit which electrically connects the activated one of said global word lines to one of said local word lines in a selected one of said units so as to achieve the same potential therebetween, and electrically connects the activated one of said global plate lines to one of said local plate lines in the selected one of said units so as to achieve the same potential therebetween.

2. The semiconductor memory device as claimed in claim 1, wherein the local word lines and the local plate lines are clamped to a ground potential in units that are not selected.

3. The semiconductor memory device as claimed in claim 1, further comprising a unit selection circuit which decodes an input column address to select one of said units, and activates a unit selection signal that is supplied to said unit switch circuit corresponding to the selected one of said units.

4. The semiconductor memory device as claimed in claim 3, wherein said unit switch circuit includes:
   a first NMOS transistor which has a drain and a source thereof connected to the activated one of said global word lines and to the one of said local word lines, respectively;
   a second NMOS transistor which has a drain and a source thereof connected to the unit selection signal and to a gate of said first NMOS transistor, respectively, and has a gate thereof connected to a power supply voltage;
   a third NMOS transistor which has a drain and a source thereof connected to the activated one of said global plate lines and to the one of said local plate lines, respectively;
   a fourth NMOS transistor which has a drain and a source thereof connected to the unit selection signal and to a gate of said third NMOS transistor, respectively, and has a gate thereof connected to the power supply voltage.

5. The semiconductor memory device as claimed in claim 4, wherein said second NMOS transistor and said fourth NMOS transistor are depletion-type transistors.

6. The semiconductor memory device as claimed in claim 3, wherein said unit switch circuit includes:
   a first transfer gate which is made up from a PMOS transistor and an NMOS transistor connected in parallel, and connects the activated one of said global word lines to the one of said local word lines; and
   a second transfer gate which is made up from a PMOS transistor and an NMOS transistor connected in parallel, and connects the activated one of said global plate lines to the one of said local plate lines.

7. The semiconductor memory device as claimed in claim 3, wherein said unit switch circuit includes:
   a gate which electrically connects the activated one of said global word lines to the one of said local word lines in response to the activation of the unit selection signal; and
   a gate which electrically connects the activated one of said global plate lines to the one of said local plate lines in response to activation of the one of said local word lines.

8. The semiconductor memory device as claimed in claim 3, wherein said unit switch circuit includes:
   a first NMOS transistor which has a drain and a source thereof connected to the activated one of said global word lines and to the one of said local word lines, respectively;
   a second NMOS transistor which has a drain and a source thereof connected to the unit selection signal and to a gate of said first NMOS transistor, respectively, and has a gate thereof connected to a power supply voltage;
   a third NMOS transistor which has a drain and a source thereof connected to the activated one of said global plate lines and to the one of said local plate lines, respectively;
   a fourth NMOS transistor which has a drain and a source thereof connected to the one of said local word lines and to a gate of said third NMOS transistor, respectively, and has a gate thereof connected to the power supply voltage.

9. The semiconductor memory device as claimed in claim 3, wherein said unit switch circuit includes:
- a gate which electrically connects the activated one of said global plate lines to the one of said local plate lines in response to the activation of the unit selection signal; and
- a gate which electrically connects the activated one of said global word lines to the one of said local word lines in response to activation of the one of said local plate lines.

10. The semiconductor memory device as claimed in claim 3, wherein said unit switch circuit includes:
- a first NMOS transistor which has a drain and a source thereof connected to the activated one of said global word lines and to the one of said local word lines, respectively;
- a second NMOS transistor which has a drain and a source thereof connected to the one of said local plate lines and to a gate of said first NMOS transistor, respectively, and has a gate thereof connected to a power supply voltage;
- a third NMOS transistor which has a drain and a source thereof connected to the activated one of said global plate lines and to the one of said local plate lines, respectively;
- a fourth NMOS transistor which has a drain and a source thereof connected to the unit selection signal and to a gate of said third NMOS transistor, respectively, and has a gate thereof connected to the power supply voltage.

* * * * *

UNITED STATES PATENT AND TRADEMARK OFFICE
CERTIFICATE OF CORRECTION

PATENT NO. : 6,330,180 B2
DATED : December 11, 2001
INVENTOR(S) : Noro et al.

It is certified that error appears in the above-identified patent and that said Letters Patent is hereby corrected as shown below:

<u>Title page,</u>
Change the "Inventors: Kouichi Noro; Yoshioka Hiroshi, both of Kawasaki (JP)" to
-- Inventor: Yoshioka Hiroshi, of Kawasaki (JP) --.

Signed and Sealed this

Twenty-first Day of May, 2002

Attest:

*Attesting Officer*

JAMES E. ROGAN
*Director of the United States Patent and Trademark Office*